(12) United States Patent
Shimizu

(10) Patent No.: US 6,580,117 B2
(45) Date of Patent: Jun. 17, 2003

(54) NON-VOLATILE SEMICONDUCTOR MEMORY DEVICE AND METHOD OF MANUFACTURING THE SAME

(75) Inventor: Shu Shimizu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/921,913

(22) Filed: Aug. 6, 2001

(65) Prior Publication Data

US 2002/0117706 A1 Aug. 29, 2002

(30) Foreign Application Priority Data

Feb. 27, 2001 (JP) ........................................ 2001-051779

(51) Int. Cl.[7] ............................................. H01L 29/788
(52) U.S. Cl. ..................... 257/315; 257/314; 257/316; 438/257; 438/435; 438/437
(58) Field of Search ................................. 438/437, 435, 438/257; 257/314, 315, 316

(56) References Cited

U.S. PATENT DOCUMENTS 6,140,208 A * 10/2000 Agahi et al.
6,245,638 B1 * 6/2001 Gardner et al.
6,313,011 B1 * 11/2001 Nouri
6,333,274 B2 * 12/2001 Akatsu et al.

FOREIGN PATENT DOCUMENTS

JP 11-177066 7/1999

* cited by examiner

*Primary Examiner*—Long Pham
(74) *Attorney, Agent, or Firm*—McDermott, Will & Emery

(57) ABSTRACT

A non-volatile semiconductor memory device includes a plurality of trenches for element-isolation formed on the main surface of a semiconductor substrate, a nitrided silicon layer formed along the wall surface of the trench, a silicon oxide film for element-isolation formed in the trench, a thermal oxide film extending from the aforementioned main surface located at the periphery of the nitrided silicon layer onto the nitrided silicon layer, the thickness of a portion located on the nitrided silicon layer of which is not less than the thickness of a portion located at the periphery of nitrided silicon layer, a floating gate electrode formed on the thermal oxide film, an insulating film, and a control gate electrode.

6 Claims, 37 Drawing Sheets

NON-VOLATILE SEMICONDUCTOR MEMORY DEVICE AND METHOD OF MANUFACTURING THE SAME

BACKGROUND OF THE INVENTION

1. Field of the Invention

The present invention relates to a non-volatile semiconductor memory device and a method of manufacturing the same, and more particularly to a structure of a non-volatile semiconductor memory device and a method of manufacturing the same, wherein reduction in thickness of an insulating film in the vicinity of a peripheral edge of an element-isolating insulating film can be prevented, while the occurrence of crystal defect attributable to expansion of the element-isolating insulating film can be prevented.

2. Description of the Background Art

Conventionally, a Shallow Trench Isolation (STI) for increasing the density of a non-volatile semiconductor memory device is known. This STI is implemented by forming a trench in a semiconductor substrate, filling it with an insulating film such as a silicon oxide film, and planarizing that insulating film.

FIG. 30 shows a cross-sectional view of a conventional non-volatile semiconductor memory device employing the aforementioned STI.

As shown in FIG. 30, the non-volatile semiconductor memory device includes a peripheral circuit portion and a memory cell portion. A trench for element-isolation 29 and a silicon oxide film 21 are formed on the main surface of a semiconductor substrate 1 in the peripheral circuit portion, and a trench for element-isolation 3 and a silicon oxide film 21 are formed on the main surface of semiconductor substrate 1 of the memory cell portion. A nitrided silicon layer 25 is formed on the wall surfaces of trenches 3 and 29.

In the memory cell portion, there is formed a memory cell transistor having a floating gate electrode 8 formed above the main surface of semiconductor substrate 1 with a thermal oxide film 4 interposed, an insulating film 9, and a control gate electrode 35.

Floating gate electrode 8 is formed of a doped polysilicon film 6, and control gate electrode 35 has a doped polysilicon film 10 and a WSi film 11. A silicon oxide film 12 is formed on control gate electrode 35.

In the peripheral circuit portion, there is formed an MOS (Metal Oxide Semiconductor) transistor having a gate electrode 13 formed above the semiconductor substrate 1 with a thermal oxide film 5 interposed. The gate electrode 13 has doped polysilicon film 10 and WSi film 11. The silicon oxide film 12 is also formed on gate electrode 13.

An interlayer insulating film 14 is formed to cover the above-mentioned memory cell transistor and MOS transistor. The interlayer insulating film 14 has a contact hole 15, in which a W plug 16 is formed. On interlayer insulating film 14, an interconnection film 17 is formed, which is electrically connected with W plug 16.

Referring now to FIGS. 31 to 41, a method of manufacturing the non-volatile semiconductor memory device having the aforementioned structure will be described.

As shown in FIG. 31, a thermal oxide film 30 is formed on the main surface of semiconductor substrate 1, and a silicon nitride film 18 is formed on the thermal oxide film 30. A photoresist 34 is formed to have a predetermined shape on silicon nitride film 18 by photolithography. Silicon nitride film 18 and thermal oxide film 30 are etched using photoresist 34 as a mask.

After removal of photoresist 34, semiconductor substrate 1 is etched using silicon nitride film 18 as a mask to form trench 3 as shown in FIG. 32. The inner wall of trench 3 is nitrided with NO, $N_2O$ or the like to form nitrided silicon layer 25.

Then, silicon oxide film 21 is deposited to fill in trench 3 as shown in FIG. 33. Thereafter, as shown in FIG. 34, CMP (Chemical Mechanical Polishing) is performed for silicon oxide film 21.

As shown in FIG. 35, silicon oxide film 21 is then wet-etched by a predetermined amount with hydrofluoric acid, silicon nitride layer 18 is removed by hot phosphoric acid, and thermal oxide film 30 is removed by hydrofluoric acid.

Then, a thermal oxide film 4 is formed, which will serve as a tunnel oxide film in the memory cell portion. At this point as shown in FIG. 36, in a region 40 where nitrided silicon layer 25 appears on the surface of semiconductor substrate 1, thermal oxide film 4 becomes locally thin, so that a thin portion 4a is formed in thermal oxide film 4 at the periphery of the element-isolating oxide film.

On the thermal oxide film 4, a doped polysilicon film 6 is formed, and on the doped polysilicon film 6, a photoresist 36 is formed. Doped polysilicon film 6 is etched using this photoresist 36 as a mask, as shown in FIG. 37.

After removal of photoresist 36, insulating film 9 is deposited on doped polysilicon film 6, and a photoresist 37 is formed to have a predetermined shape on insulating film 9 as shown in FIG. 38. Being etched using this photoresist 37 as a mask, insulating film 9, doped polysilicon film 6, and thermal oxide film 4 on the peripheral circuit portion are removed.

Then, as shown in FIG. 39, thermal oxide film 5 is formed on the peripheral circuit portion. At this point, in a region where nitrided silicon layer 25 appears on the surface of semiconductor substrate 1, thermal oxide film 5 becomes locally thin, so that a thin portion is formed in thermal oxide film 5 at the periphery of the element-isolating oxide film.

Doped polysilicon film 10, WSi film 11 and silicon oxide film 12 are deposited on thermal oxide film 5 and insulating film 9. As shown in FIG. 39, a photoresist 38 is formed to have a predetermined shape on silicon oxide film 12, and silicon oxide film 12 is etched using photoresist 38 as a mask.

After removal of photoresist 38, WSi film 11 and doped polysilicon film 10 are etched using silicon oxide film 12 as a mask. Accordingly, as shown in FIG. 40, control gate electrode 35 in the memory cell portion and gate electrode 13 of MOS transistor in the peripheral circuit portion are formed.

Thereafter, as shown in FIG. 41, a photoresist 39 covering the peripheral circuit portion is formed, and insulating film 9 and doped polysilicon film 6 in the memory cell portion are etched using photoresist 39 as a mask. Accordingly, floating gate electrode 8 of the memory cell portion is formed.

Then, following a prescribed impurity implantation, interlayer-insulating film 14 is deposited. In this interlayer insulating film 14, a contact hole 15 is formed, in which the W plug is formed. Interconnection film 17 is formed on interlayer insulating film 14. Through the above steps, the non-volatile semiconductor memory device shown in FIG. 30 is formed.

When a thermal oxidation process is performed for forming the above mentioned thermal oxide film 4 and the like, oxidation may possibly develop from the inner wall of the trench, and the filled silicon oxide film 21 may undesirably expand. When silicon oxide film 21 expands, a large stress is exerted onto semiconductor substrate 1 to adversely increase crystal defect density in semiconductor substrate 1.

In the non-volatile semiconductor memory device shown in FIG. 30, however, nitrided silicon layer 25 is formed on the inner walls of trenches 3 and 29, so that the aforementioned expansion of silicon oxide film 21 can be prevented, and thus increase in crystal defect density in semiconductor substrate 1 can be prevented.

On the other hand, since nitrided silicon layer 25 reaches up to the main surface of semiconductor substrate 1 as shown in FIG. 35, upon formation of thermal oxide film 4 in the subsequent step, the growth of thermal oxide film 4 is inhibited on nitrided silicon layer 25. Therefore, as shown in FIG. 36, the thermal oxide film 4 is reduced in thickness on nitrided silicon layer 25, resulting in formation of thin portion 4a as previously mentioned.

Presence of such thin portion 4a lowers a breakdown voltage in this portion, for example, to make it difficult to ensure the desired electric characteristics and reliability.

SUMMARY OF THE INVENTION

The present invention is made to solve the above mentioned problem, and its objet is to improve the electric characteristics and reliability of a non-volatile semiconductor memory device in which a nitrided silicon layer is formed on the inner wall of a trench for element-isolation.

A non-volatile semiconductor memory device in accordance with the present invention includes: a semiconductor substrate having a main surface; a plurality of trenches for element-isolation formed in the semiconductor substrate; a nitrided silicon layer formed along a wall surface of the trench; a first insulating film for element-isolation formed in the trench; a second insulating film extending from the aforementioned main surface located at the periphery of the nitrided silicon layer onto the nitrided silicon layer, the thickness of a portion located on the nitrided silicon layer being at least the thickness of a portion located at the periphery of the nitrided silicon layer; a floating gate electrode formed on the second insulating layer; and a control gate electrode on the floating gate electrode with a third insulating film interposed.

The formation of the nitrided silicon layer along the wall surface of the trench as mentioned above can prevent oxidation and resulting expansion of the first insulating film for element-isolation, and can decrease the crystal defect density in the semiconductor substrate. Furthermore, as the thickness of the second insulating film located on the nitrided silicon layer is made the same or thicker than the thickness of the second insulating layer located at the periphery of the nitrided silicon layer, the desired electric characteristics and reliability on the nitrided silicon layer can be ensured.

The aforementioned trench is formed by etching the semiconductor substrate using at least a part of the floating gate electrode as a mask.

The trench is formed self-aligned to the floating gate electrode in this manner, so that the high density integration of the non-volatile semiconductor memory device can be attained.

The aforementioned nitrided silicon layer is preferably formed by nitriding the wall surface of the trench after oxidation thereof.

Therefore, before formation of the nitrided silicon layer, the oxide film of a desired thickness can be formed in advance at the upper end portion of the trench, under which the nitrided silicon layer can be formed. As a result, the growth of the second insulating film, that would be otherwise held back by the nitrided silicon layer, is ensured. Further, the thickness of the second insulating film located on the nitrided silicon layer can be made equal to or larger than the thickness of the second insulating film located at the periphery of the nitrided silicon layer. It is noted that when a bird's beak caused by oxidation of the wall surface of the trench is extended onto the region where the nitrided silicon layer is to be formed, the thickness of the second insulating film located on the nitrided silicon layer can be made equal to or larger than the thickness of the second insulating film located at the periphery of the nitrided silicon layer.

The above mentioned non-volatile semiconductor memory device includes a memory cell portion, in which memory cell transistors are formed, and a peripheral circuit portion, in which peripheral circuitry is formed, for controlling the operation of the memory cell transistor. The aforementioned trench is formed in the memory cell portion.

Accordingly, while the density of the element (memory cell transistor) in the memory cell portion can be increased, crystal defect can be prevented, and the electric characteristics and reliability in the memory cell portion can be improved.

A fourth insulating film for element-isolation may be formed in the aforementioned peripheral circuit portion by selective oxidation of the semiconductor substrate (LOCOS: Local Oxidation of Silicon). This enables the fourth insulating film to be formed in simple process as compared with trench isolation.

The non-volatile semiconductor memory device includes a memory cell portion, a peripheral circuit portion, and an MOS (Metal Oxide Semiconductor) transistor in the peripheral circuit portion. In this case, the above mentioned trench includes a first trench formed in the memory cell portion, and a second trench formed in the peripheral circuit portion, and the nitrided silicon layer includes first and second nitrided silicon layers respectively formed along the wall surfaces of the first and second trenches. The first insulating film is formed in the first trench, and a fourth insulating film for element-isolation is formed in the second trench. The second insulating film is formed at the periphery of the first trench, and a fifth insulating film is formed at the periphery of the second trench. The second insulating film extends from the main surface located at the periphery of the first nitrided silicon layer onto the first nitrided silicon layer, and the thickness of a portion located on the first nitrided silicon layer in the second insulating film is equal to or larger than the thickness of a portion located on the main surface of the periphery of the first nitrided silicon layer in the second insulating film. The fifth insulating film extends from on the main surface located at the periphery of the second nitrided silicon layer onto the second nitrided silicon layer, and the thickness of a portion located on the second nitrided silicon layer in the fifth insulating film is at least the thickness of a portion located on the main surface of the periphery of the second nitrided silicon layer in the fifth insulating film. A gate electrode of the MOS transistor is formed on the fifth insulating film.

The trench isolation structure is formed in both of the memory cell portion and the peripheral circuit portion in this manner, so that in both of the memory cell portion and the peripheral circuit portion, crystal defect can be prevented while the density of the elements is increased, and in addition, the electric characteristics and reliability can be improved.

A method of manufacturing a non-volatile semiconductor device in accordance with the present invention includes the following steps. A mask film including a first conductive film is formed on a main surface of a semiconductor substrate with a first insulating film interposed. This mask film is used to etch the semiconductor substrate, so that a plurality of trenches for element-isolation are formed. A wall surface of the trench is oxidized. After this oxidation, the wall surface of the trench is nitrided to form a nitrided silicon layer extending along the wall surface of the trench. A second insulating film for element-isolation is formed in the trench. By reducing the thickness of the mask film, the first conductive film is exposed. A second conductive film is formed above the first conductive film with a third insulating film interposed. By patterning the second conductive film, the third insulating film and the first conductive film, a floating gate electrode and a control gate electrode are formed.

Since the wall surface of the trench is oxidized after formation of the first insulating film and the wall surface of the trench is nitrided thereafter, the nitrided silicon layer can be formed under the first insulating film. Therefore, unlike the conventional example in which the oxide film is grown on the nitrided silicon layer, the first insulating film of a desired thickness can be formed on the nitrided silicon layer. As a result, the electric characteristics and reliability of the non-volatile semiconductor memory device can be improved as stated above.

The step of oxidizing the wall surface of the trench preferably includes the step of forming an oxide film on the wall surface of the trench such that it reaches the first insulating film. In this case, the step of forming the nitrided silicon layer preferably includes the step of forming the nitrided silicon layer such that it extends along the trench, in the region located on the periphery of the oxide film and under the first insulating film, by nitriding the wall surface of the trench from on the oxide film.

The wall surface of the trench is nitrided from the aforementioned oxide film formed on the wall surface of the trench in advance in this way, so that the nitrided silicon layer can be formed at the periphery of the oxide film and under the first insulating film. At this point, a bird's beak can be formed on the region where the nitrided silicon layer is to be formed, in which case, the thickness of the first insulating film located on the nitrided silicon layer can be made equal to or larger than the thickness of the first insulating film located at the periphery of the nitrided silicon layer.

The floating gate electrode may have a third conductive film stacked on the first conductive film. In this case, the step of forming the second conductive film includes the steps of forming on the first conductive film the third conductive film to extend over the second insulating film, and forming the third insulating film to cover the third conductive film. Furthermore, the step of forming the floating gate electrode and the control gate electrode includes the step of forming the floating gate electrode and the control gate electrode, by patterning the second conductive film, the third insulating film, the third conductive film and the first conductive film.

By stacking the third conductive film on the first conductive film as mentioned above, the floating gate electrode can be formed in a stacked structure of the conductive films. Furthermore, by forming the first and third conductive films separately, the first and third conductive films can be formed to a desired thickness, while a good state of an interface with other elements in contact with the first and third conductive films can be kept. Still further, by adjusting concentration of the impurity to be doped into the first and third conductive films properly, a desired resistance value of the floating gate electrode can be attained. In addition, since the third conductive film extends over the second insulating film, the surface area of the third conductive film can be made greater than the surface area of the first conductive film, and the surface area of the floating gate electrode can be increased. Therefore, the coupling ratio of the floating gate electrode to control gate electrode can be improved.

The above mentioned non-volatile semiconductor memory device includes a memory cell portion and a peripheral circuit portion. The trench is formed in the memory cell portion, and a fourth insulating film for element-isolation is formed in the peripheral circuit portion. In this case, the step of forming the mask film includes the step of forming the mask film after formation of the fourth insulating film in the peripheral circuit portion. Furthermore, the aforementioned fourth insulating film may be formed by selectively oxidizing the semiconductor substrate.

The fourth insulating film for element-isolation is formed in the peripheral circuit portion before formation of the memory cell portion, so that proper element-isolating structure can be respectively selected in the peripheral circuit portion and the memory cell portion. Furthermore, by forming the fourth insulating film in the peripheral circuit portion, for example, by LOCOS process, the fourth insulating film can be formed in a simple process as compared with the trench isolation.

The above mentioned non-volatile semiconductor memory device includes a memory cell portion, a peripheral circuit portion, and an MOS transistor in the peripheral circuit portion, the trench includes a first trench formed in the memory cell portion and a second trench formed in the peripheral circuit portion, the nitrided silicon layer includes a first and second nitrided silicon layers respectively formed along the wall surfaces of the first and second trenches, and the second insulating film is formed in the first and second trenches. In this case, the step of forming the trench includes the step of forming the second trench in the peripheral circuit portion along with forming the first trench in the memory cell portion. The step of oxidizing the wall surface of the trench includes the step of oxidizing the wall surfaces of the first and second trenches. The step of forming the nitrided silicon layer includes the step of forming the first and second nitrided silicon layers along the wall surfaces of the first and second trenches. The step of forming the second insulating film includes the step of forming the second insulating film in the first and second trenches. The step of forming the floating gate electrode and the control gate electrode includes the step of forming the floating gate electrode and the control gate electrode in the memory cell portion along with forming a gate electrode of the MOS transistor in the peripheral circuit portion, by patterning the second conductive film, the third insulating film and the first conductive film.

The trench isolation region is formed in the memory cell portion and the peripheral circuit portion at the same time in this manner, so that the step can be simplified as compared with formation of isolation region in each portion in different steps. Furthermore, the nitrided silicon layer is formed in the wall surfaces of both the memory cell portion and the peripheral circuit portion by the aforementioned technique, so that the electric characteristics and reliability for the elements both in the memory cell portion and in the peripheral circuit portion can be improved while increase in crystal defect density can be prevented.

The floating gate electrode and the gate electrode of the above-mentioned MOS transistor may have a third conductive film on the first conductive film. In this case, the step of forming the second conductive film includes the steps of forming on the first conductive film the third conductive film to extend over the second insulating film, and forming the third insulating film to cover the third conductive film, and the step of forming the floating gate electrode and the control gate electrode includes the step of forming the floating gate electrode and the control gate electrode in the memory cell portion along with forming the gate electrode of the MOS transistor in the peripheral circuit portion, by patterning the second conductive film, the third insulating film, the third conductive film and the first conductive film.

In this case, while the coupling ratio of the floating gate electrode to the control gate electrode can be improved, the gate electrode of the MOS transistor in the peripheral circuit portion can be provided in a multi-layered structure including the first to third conductive layers.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described with reference to FIGS. 1 to 29.

(First Embodiment)

Figure 1:
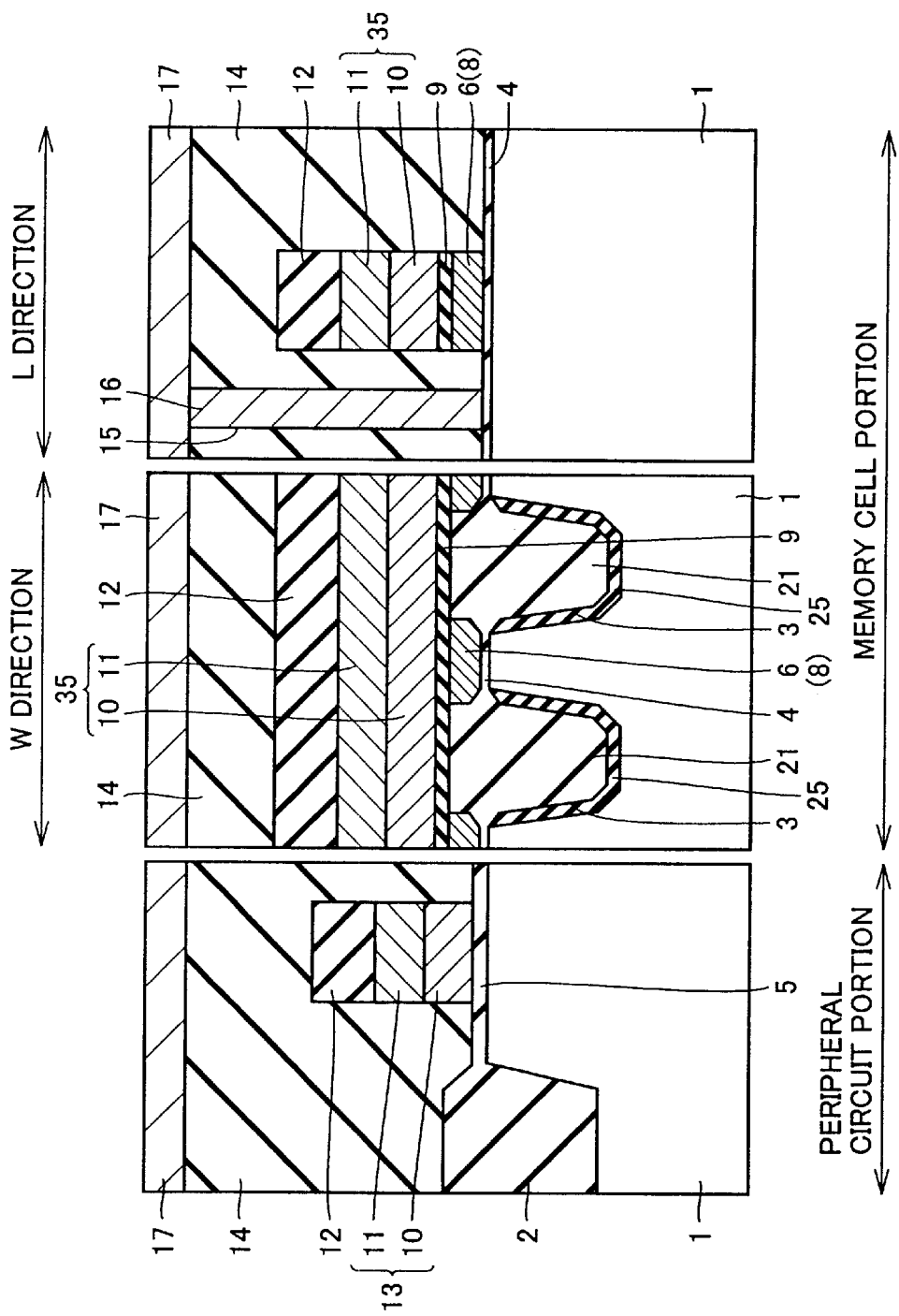
FIG. 1 is a cross-sectional view of a non-volatile semiconductor memory device in accordance with a first embodiment of the present invention.

FIG. 1 is a cross sectional view of a peripheral circuit portion and a memory cell portion of a non-volatile semiconductor memory device in accordance with a first embodiment of the present invention. It is noted that in FIG. 1, W direction refers to a width direction of the memory cell portion and L direction refers to a length direction of the memory cell portion.

As shown in FIG. 1, a silicon oxide film for element-isolation 2 is formed on a main surface of a semiconductor substrate 1 in the peripheral circuit portion, and a trench for element-isolation 3 and a silicon oxide film 21 are formed at the main surface of semiconductor substrate 1 in the memory cell portion. Note that the aforementioned silicon oxide film 2 may be formed in a trench (not shown) provided in the peripheral circuit portion.

Trench 3 has a depth of about 400 nm and is formed in a self-alignment manner by etching semiconductor substrate 1 using a doped polysilicon film 6, which will be described later, as a mask. High density of the non-volatile semiconductor memory device can thereby be attained.

A nitrided silicon layer 25 is formed along an inner wall of trench 3. The presence of this nitrided silicon layer 25 can prevent the expansion of silicon oxide film 21 in a thermal oxidation process after formation of silicon oxide film 21. Therefore, increase in crystal defect density in semiconductor substrate 1 attributable to this expansion can be prevented.

Further, as shown in FIG. 1, the thickness of a thermal oxide film (insulating film) 4 located on nitrided silicon layer 25 is equal to or larger than the thickness of thermal oxide film 4 located at the periphery of nitrided silicon layer 25. Thus, at an edge portion of silicon oxide film 21 for element-isolation, a thin portion 4a which causes a problem in a conventional example does not exist, thereby the increase in the electric characteristics and reliability of the elements can be attained.

In the memory cell portion, there is formed a memory cell transistor having a floating gate electrode 8 formed above the main surface of semiconductor substrate 1 with thermal oxide film (tunnel insulating film) 4 interposed, an insulating film 9, and a control gate electrode 35.

The thickness of thermal oxide film 4 is about 10 nm. Floating gate electrode 8 is formed of doped polysilicon film 6 having a thickness of about 100 nm. Control gate electrode 35 is formed above floating gate electrode 8 with insulating film 9 interposed.

Insulating film 9 is formed, for example, of a stacked, three-layered insulating films (ONO film) including an oxide film about 5 nm thick, a nitride film about 10 nm thick, and an oxide film about 5 nm thick.

Control gate electrode 35 has a doped polysilicon film 10 having a thickness of about 100 nm, and a WSi film 11 having a thickness of about 100 nm. A silicon oxide film 12 having a thickness of about 200 nm is formed on control gate electrode 35.

In the peripheral circuit portion, there is formed an MOS transistor having a gate electrode 13 formed on the main surface of semiconductor substrate 1 with a thermal oxide film (gate insulating film) 5 interposed. Gate electrode 13 has doped polysilicon film 10 and WSi film 11. Silicon oxide film 12 is formed also on gate electrode 13.

An interlayer insulating film 14, for example, of a silicon oxide film about 1000 nm thick is formed to cover the aforementioned memory cell transistor and MOS transistor.

Interlayer insulating film 14 has a contact hole 15, in which a W plug 16 is formed. On interlayer insulating film 14, an interconnection film 17 is formed, which is electrically connected with W plug 16 and made of Al—Cu or the like.

Referring now to FIGS. 2 to 13, a method of manufacturing the nonvolatile semiconductor memory device having the above stated structure will be described.

Figure 2:
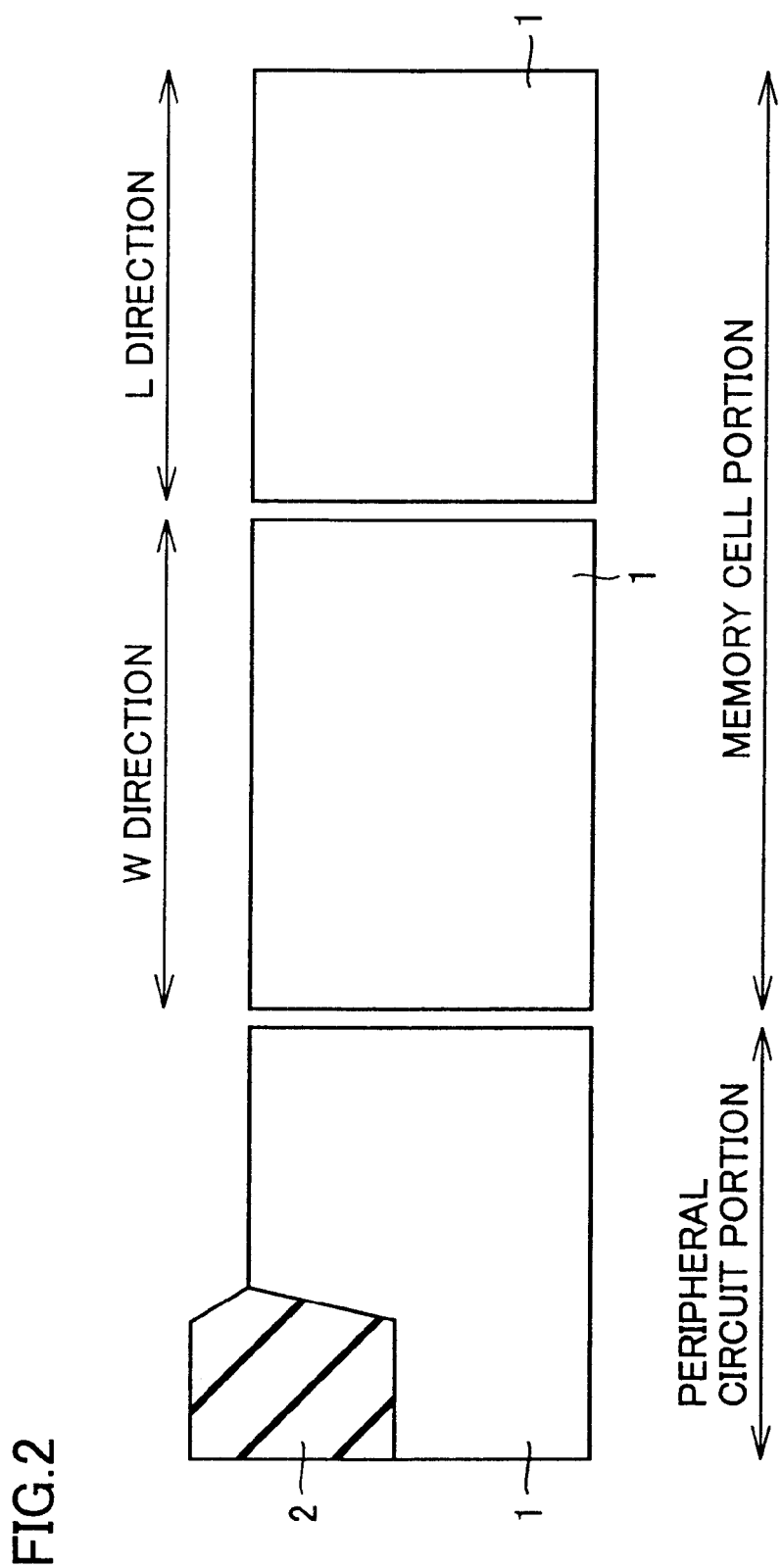
FIGS. 2 to 13 are cross-sectional views showing first to twelfth steps of a method of manufacturing the non-volatile semiconductor memory device shown in FIG. 1.

As shown in FIG. 2, silicon oxide film (insulating film) for element-isolation 2 is formed by selectively oxidizing the main surface of semiconductor substrate 1 in the peripheral circuit portion (by LOCOS: Local Oxidation of Silicon).

It is noted that formation of a trench isolation region may be effected by forming a trench in the peripheral circuit portion by well-known technique and filing in this trench with an insulating film such as a silicon oxide film. At this point, the element-isolating region is not yet formed in the memory cell portion. Furthermore, nitriding of the inner wall of the trench is not yet performed.

Then, following photolithography, using a photoresist (not shown) as a mask, a phosphorus ion or an arsenic ion is implanted into semiconductor substrate 1 to form an n-well (not shown). Thereafter, photolithography is performed again, and using a photoresist (not shown) as a mask, a boron ion is implanted into semiconductor substrate 1 to form a p-well (not shown).

Thermal oxide film 4 is then formed, which will serve as a tunnel insulating film in the memory cell portion. Doped polysilicon film 6 is deposited on this thermal oxide film 4 by CVD (Chemical Vapor Deposition) or the like, followed by deposition of a silicon nitride film (insulating film) 18 having a thickness of about 200 nm.

Figure 3:
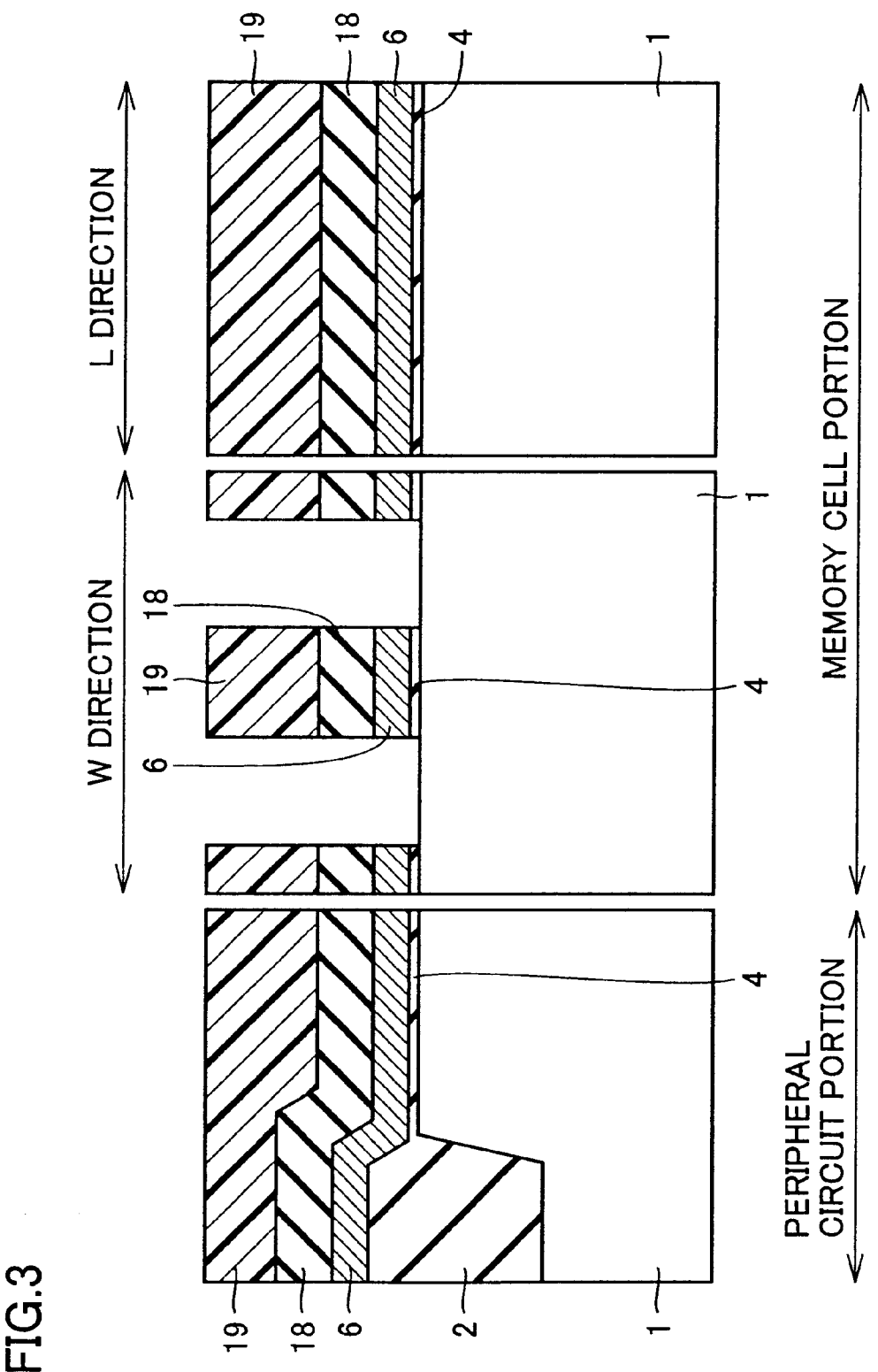

After application of a photoresist 19 on silicon nitride film 18 by photolithography, photoresist 19 is patterned into a predetermined shape. Using this photoresist 19 as a mask, as shown in FIG. 3, silicon nitride film 18, doped polysilicon film 6 and thermal oxide film 4 are dry-etched.

After removal of photoresist 19, using silicon nitride film 18, doped polysilicon film 6 and thermal oxide film 4 as a mask (mask film), semiconductor substrate 1 is dry-etched.

Figure 4:
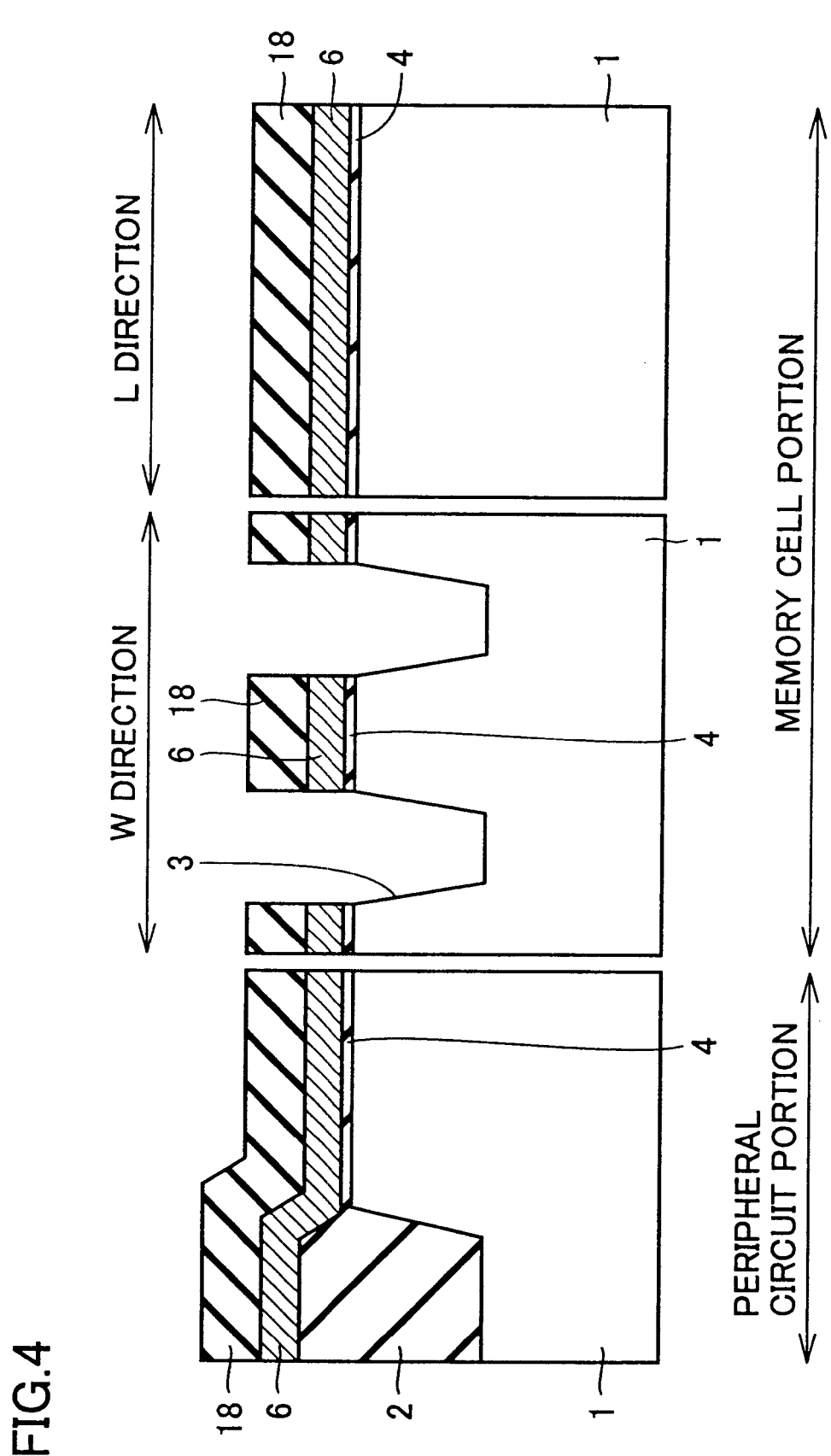

Trench for element-isolation 3 is thereby formed in the memory cell portion, as shown in FIG. 4. By forming trench 3 using the above mentioned mask film, trench 3 can be formed self-aligned to doped polysilicon film (a conductive film serving at least as a part of the floating gate electrode) 6.

Figure 5:
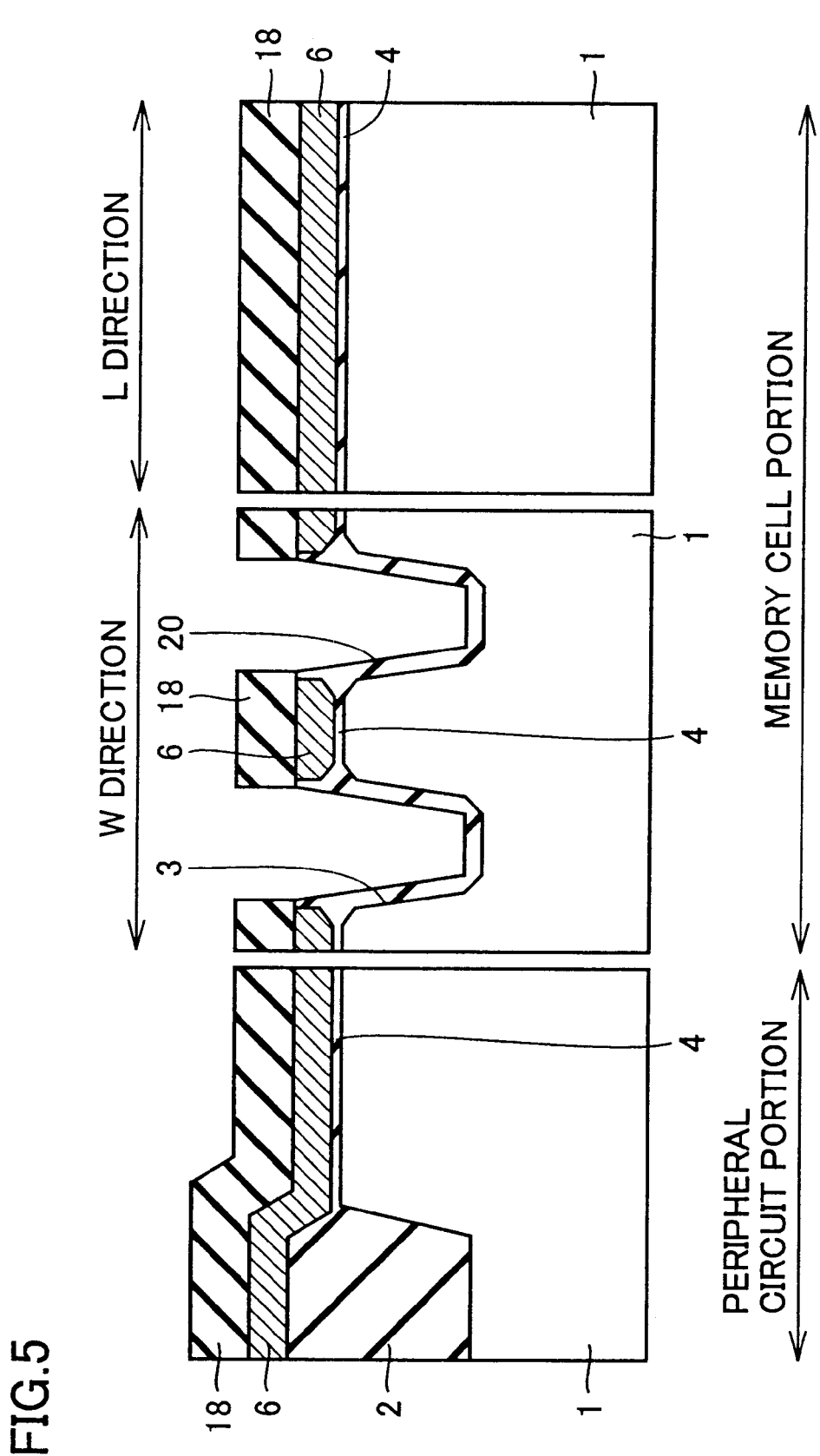

Then, the inner wall of trench 3 is thermally oxidized by approximately 50 nm. This forms a thermal oxide film 20 as shown in FIG. 5. At this point, the final field edge is established. Here, by forming a bird's beak, the bird's beak reaches thermal oxide film 4, so that a thick oxide film (an insulating film) can be formed on the region where the nitrided silicon layer 25 is to be formed.

Figure 6:
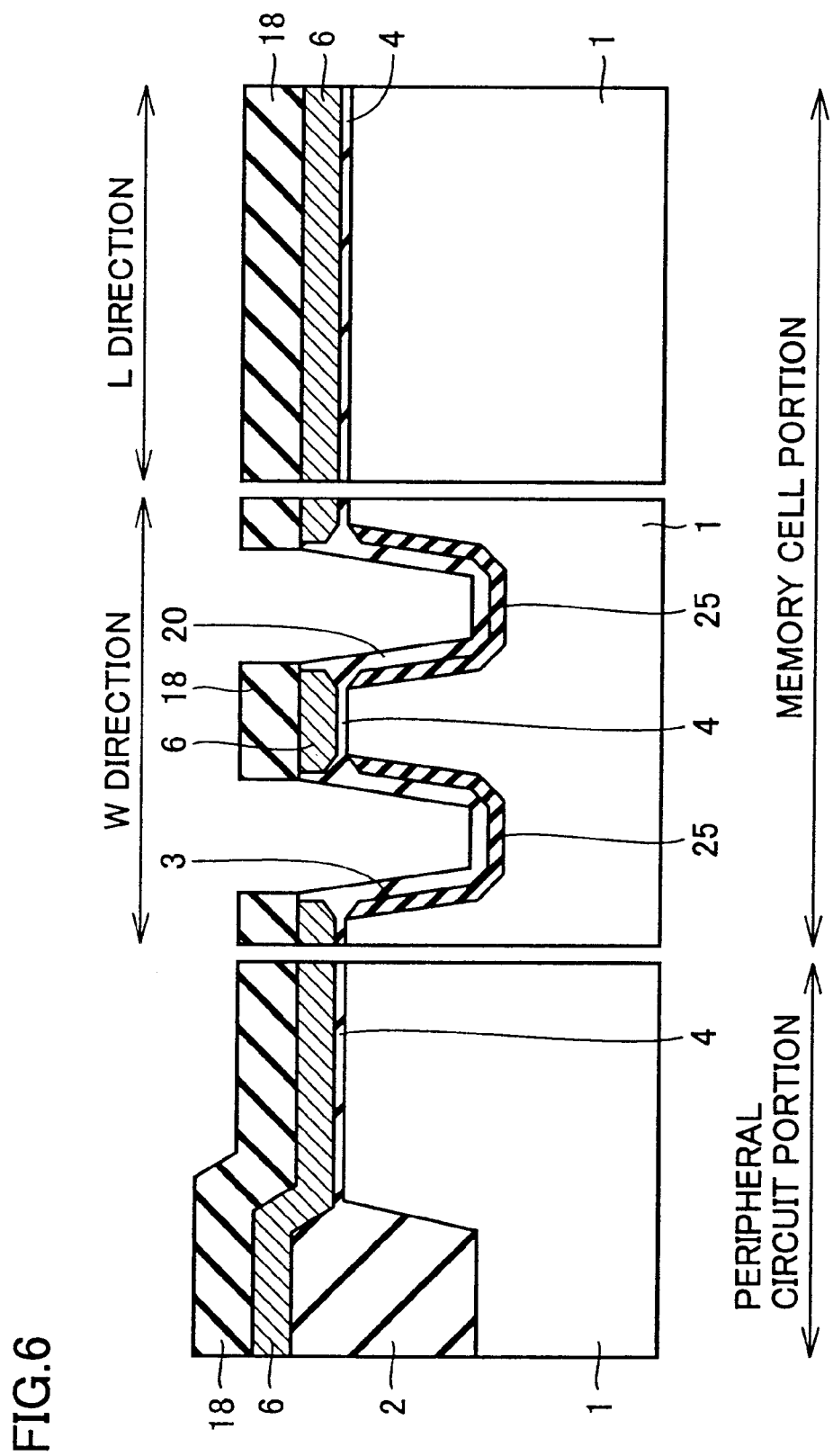

Then, the inner wall of trench 3 is thermally nitrided with a gas containing nitrogen atoms including NO, $N_2O$, and the like. This forms nitrided silicon layer 25 as shown in FIG. 6. Since thermal oxide film 4 has been already formed at this point, thermal oxide film 4 is not locally thinned at the field edge as seen in the conventional example.

Furthermore, since the peripheral circuit portion is covered with doped polysilicon film 6 and silicon nitride film 18, semiconductor substrate 1 in the peripheral circuit portion is not nitrided. Therefore, when thermal oxide film 5 is formed which will serve as a gate oxide film of the transistor in the peripheral circuit portion in the following step, thermal oxide film 4 will not be locally thinned at the field edge, either.

Figure 7:
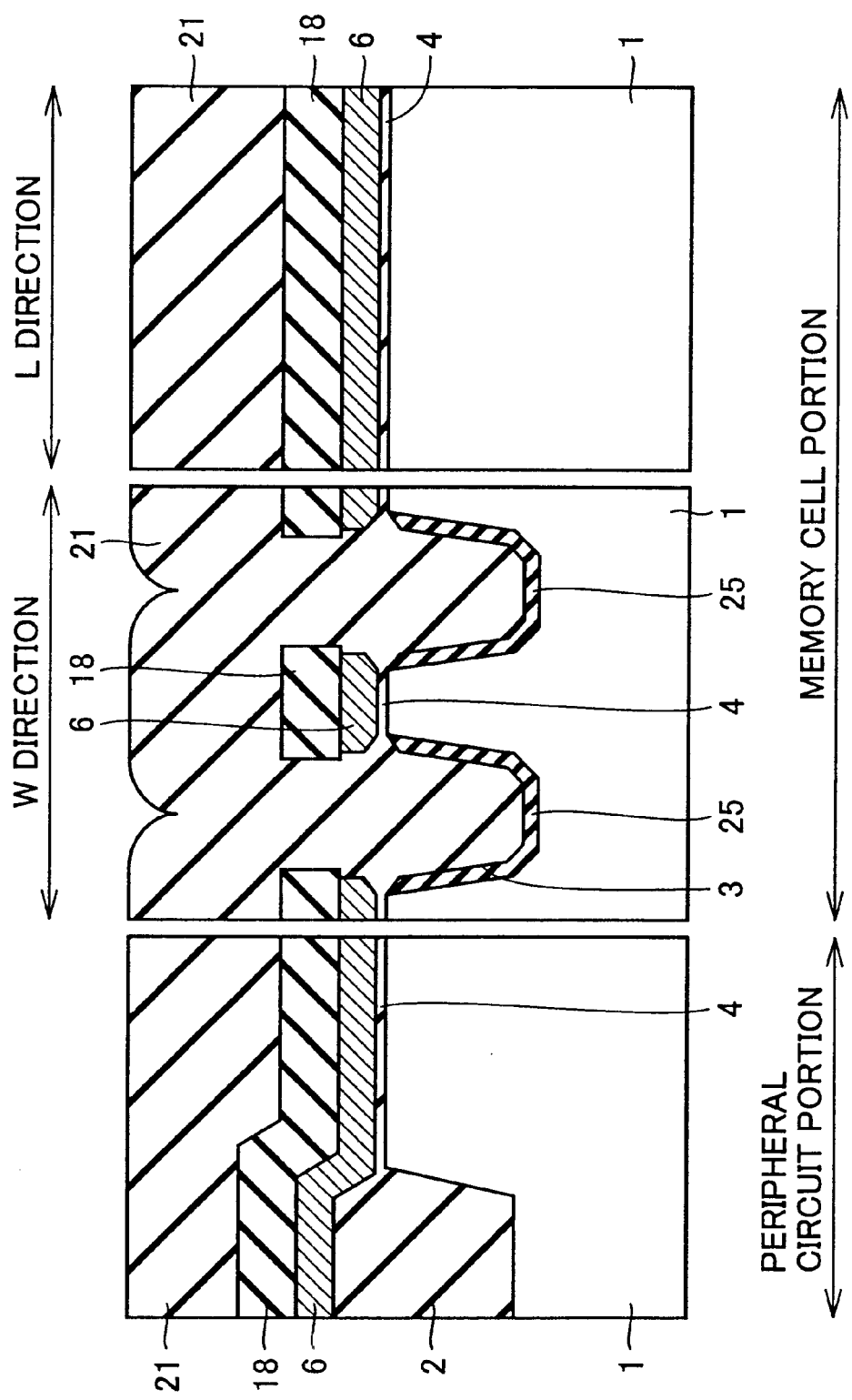

Then, silicon oxide film (an insulating layer) 21 of about 500 nm is deposited by CVD or the like, as shown in FIG. 7, so that silicon oxide film 21 fills in trench 3, and in addition silicon oxide film 21 is formed on silicon nitride film 18.

Figure 8:
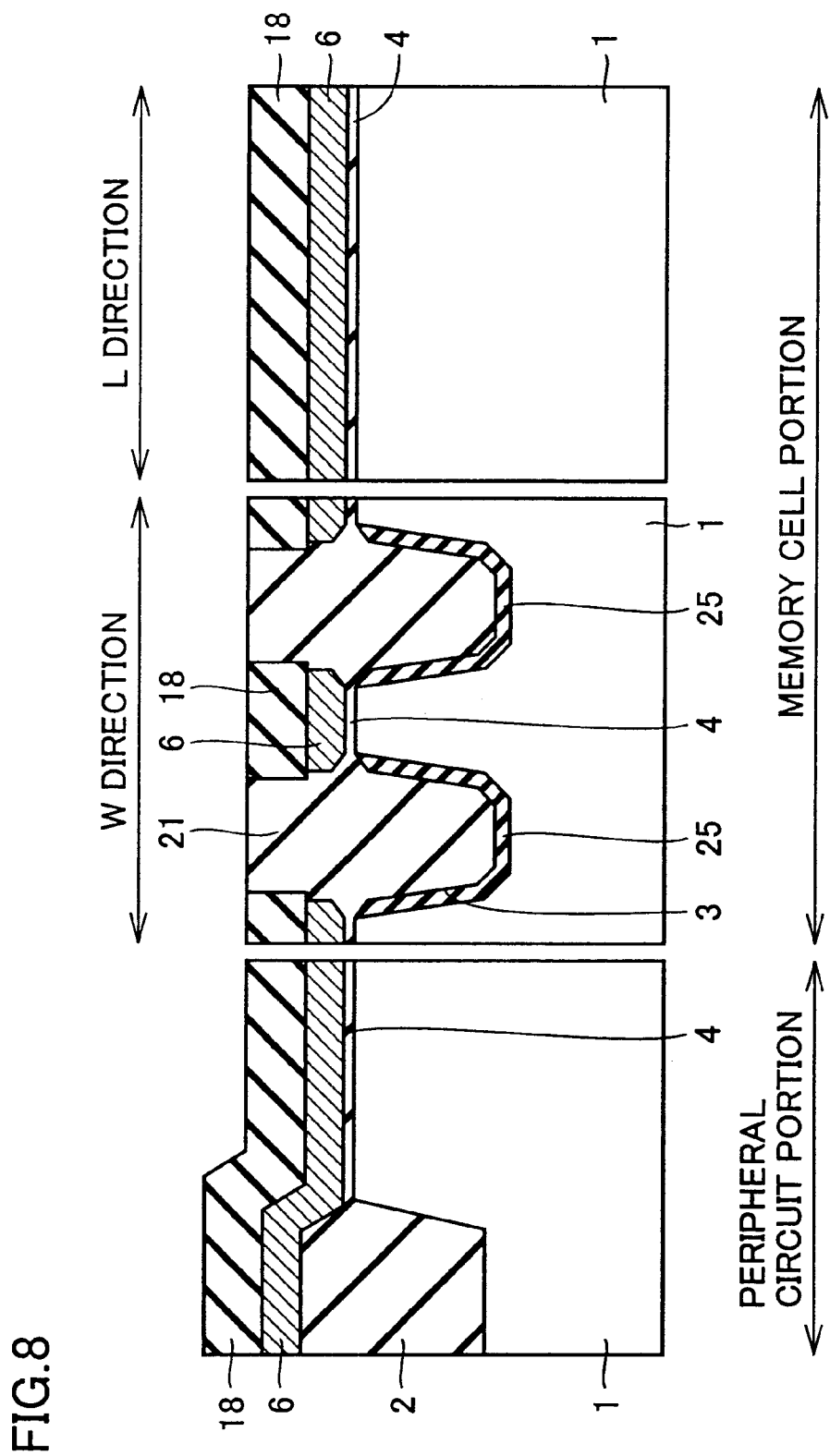

Silicon oxide film 21 is then reduced in thickness. Specifically, silicon oxide film 21 is polished, for example, by CMP (Chemical Mechanical Polishing) to be reduced in its thickness. The surface of silicon nitride film 18 is thereby exposed as shown in FIG. 8.

Figure 9:
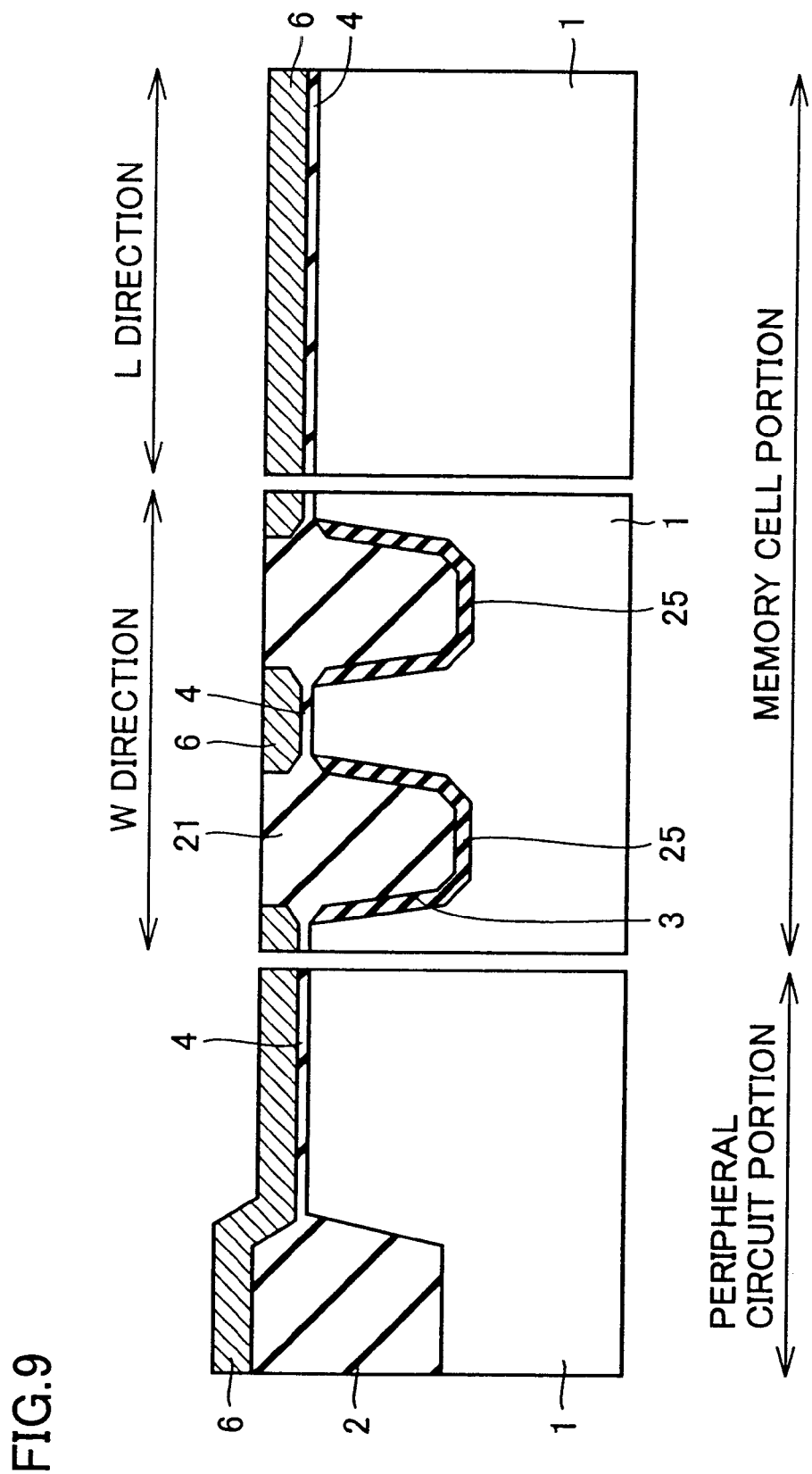

Then, after wet-etching of silicon oxide film 21 with hydrofluoric acid by a predetermined amount, silicon nitride film 18 is removed by hot phosphoric acid. In other words, the thickness of the above mentioned mask film is reduced. Doped polysilicon film 6 is thus exposed, as shown in FIG. 9. At this point, Shallow Trench Isolation (STI) in accordance with the present invention is formed.

Figure 10:
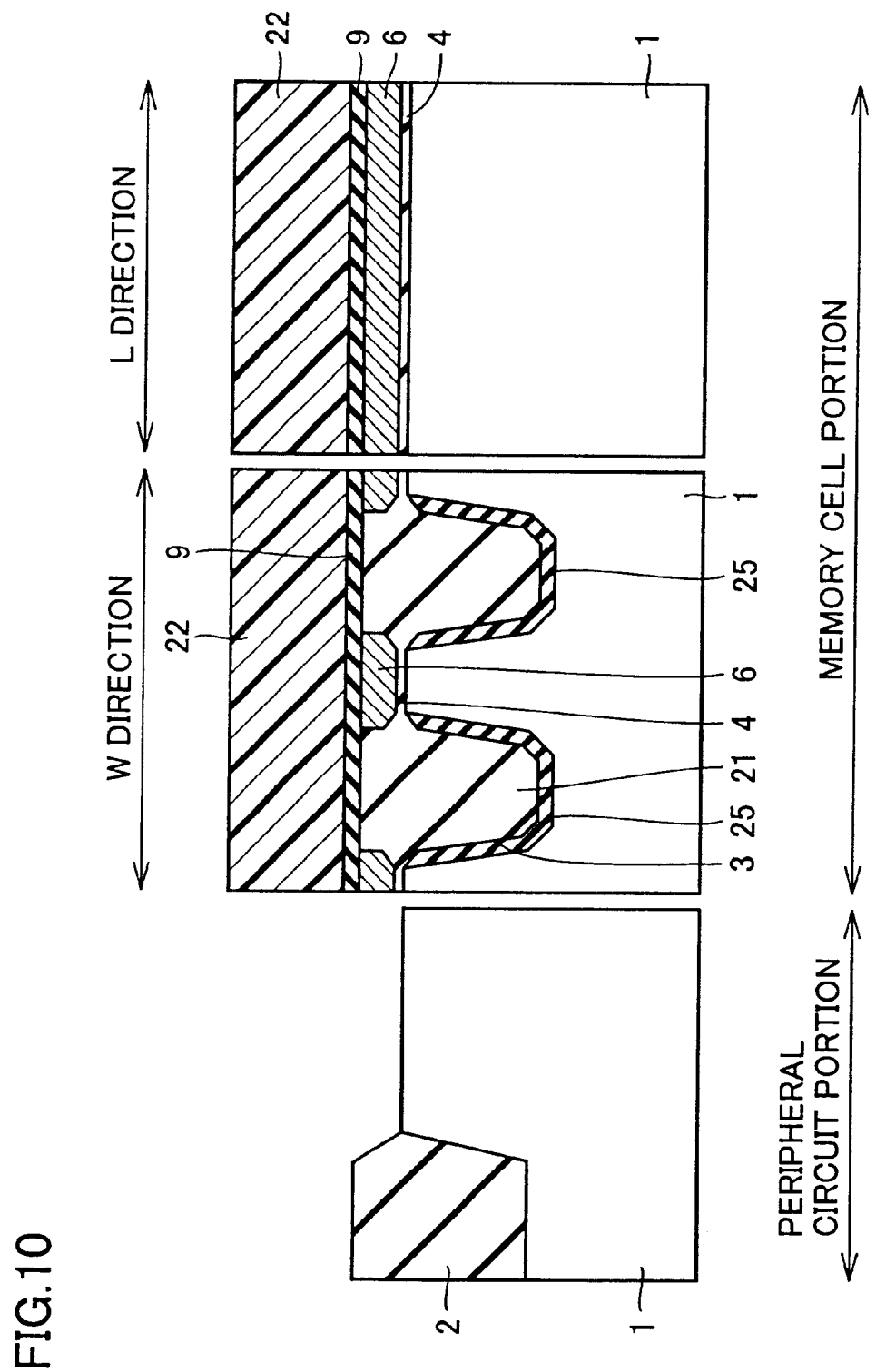

Then, insulating film 9 of three-layered structure including the oxide film, the nitride film and the oxide film is deposited by CVD or the like. On this insulating film 9, a photoresist 22 covering the memory cell portion is formed by photolithography. As shown in FIG. 10, insulating film 9 and doped polysilicon film 6 in the peripheral circuit portion are removed by dry-etching using photoresist 22 as a mask, and thermal oxide film 4 is removed by hydrofluoric acid.

Figure 11:
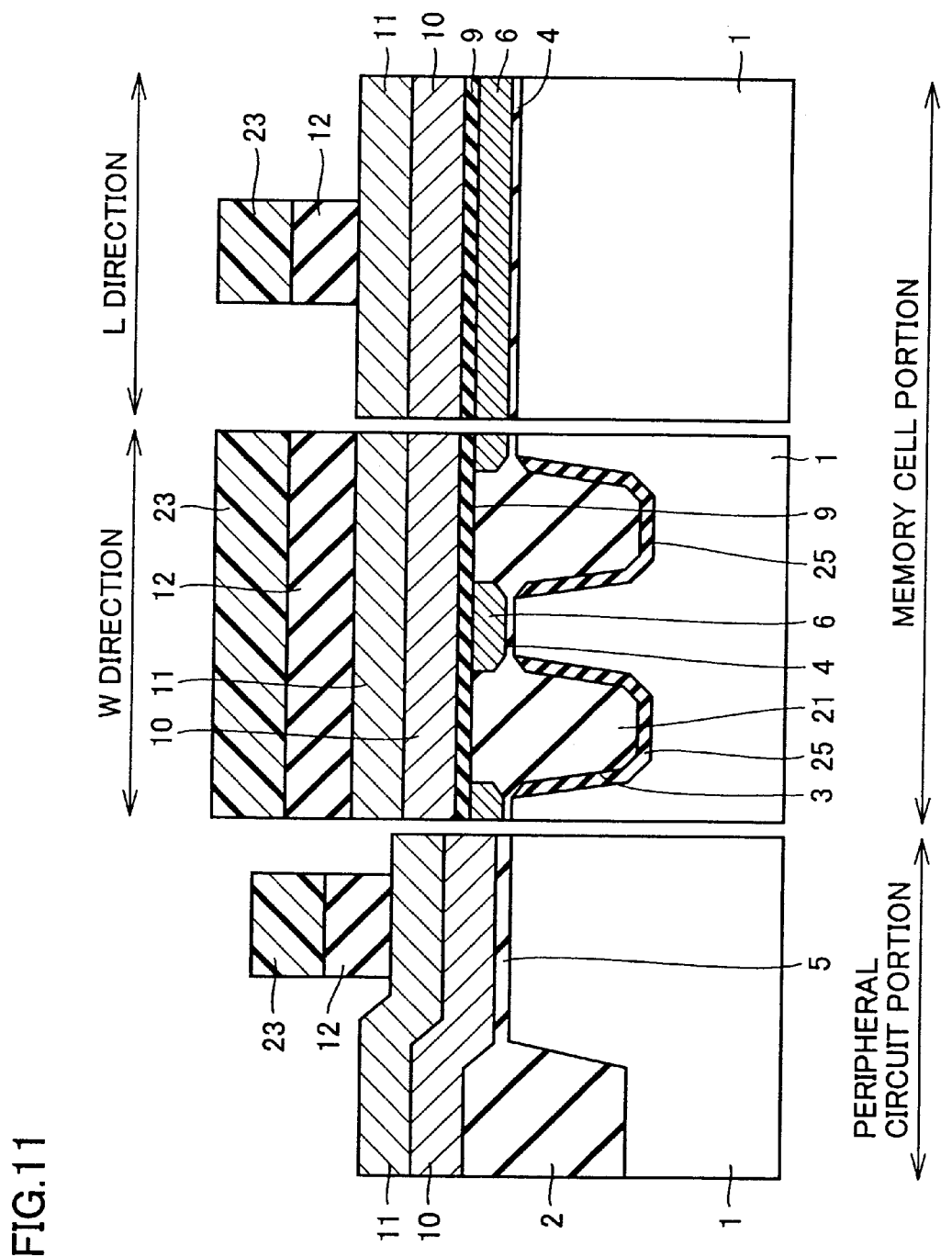

Then, as shown in FIG. 11, a thermal oxide film 5 having a thickness of about 20 nm is formed, which will serve as a gate oxide film of the transistor in the peripheral circuit portion. Here, the nitride film in insulating film 9 can prevent oxidation of the under layer in the memory cell portion.

Then, doped polysilicon film 10 and WSi film 11 serving as gate electrode 13 of the transistor in the peripheral circuit portion and control gate electrode 35 in the memory cell portion, as well as silicon oxide film 12 are deposited in order. A photoresist 23 in a predetermined shape is formed on silicon oxide film 12 by photolithography, and silicon oxide film 12 is etched using photoresist 23 as a mask.

Figure 12:
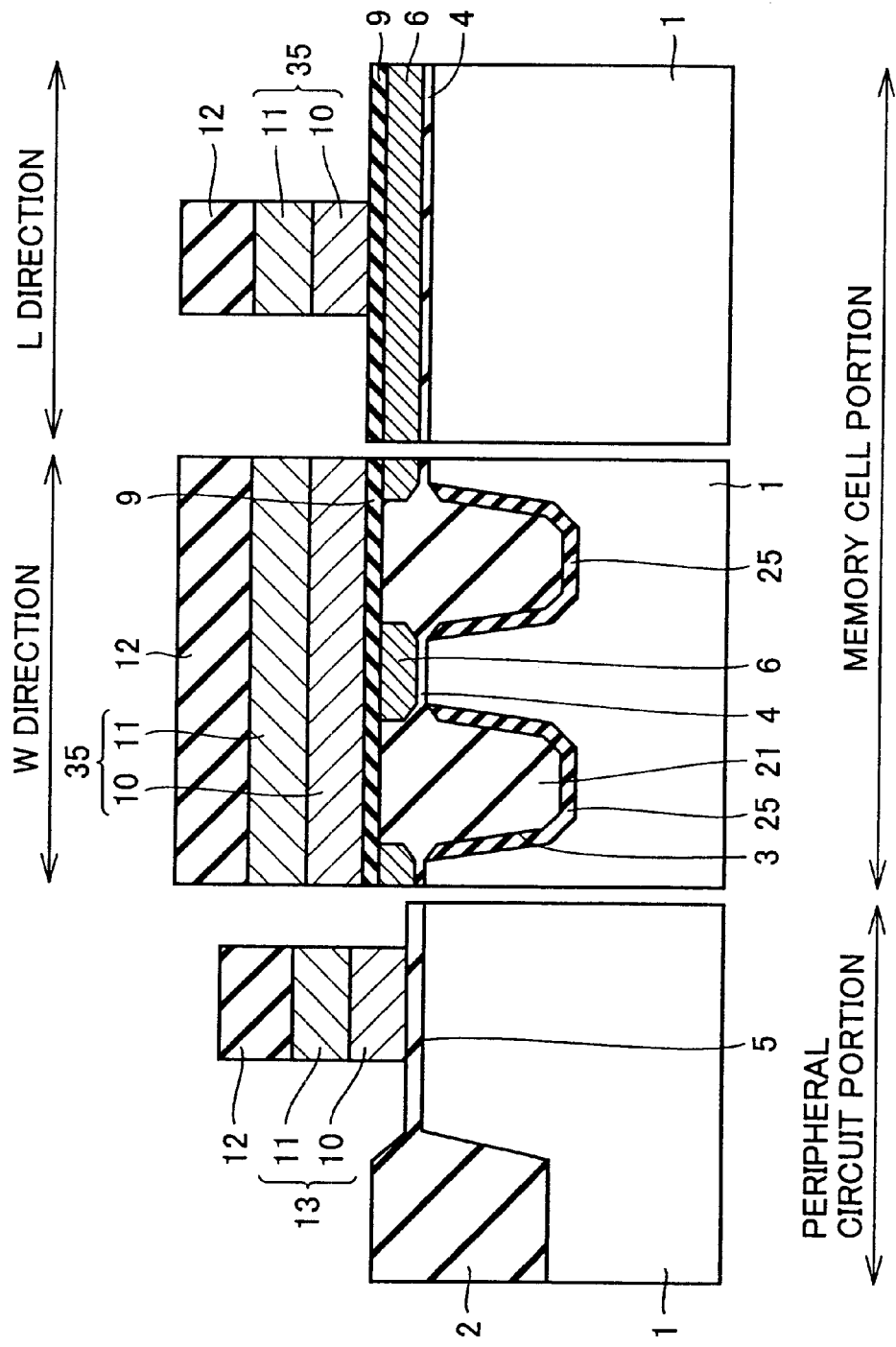

After removal of photoresist 23, doped polysilicon film (conductive film) 10 and WSi film 11 is dry-etched using the patterned silicon oxide film 12 as a mask. Accordingly, as shown in FIG. 12, gate electrode 13 of the transistor in the peripheral circuit portion and control gate electrode 35 in the memory cell portion are formed.

Figure 13:
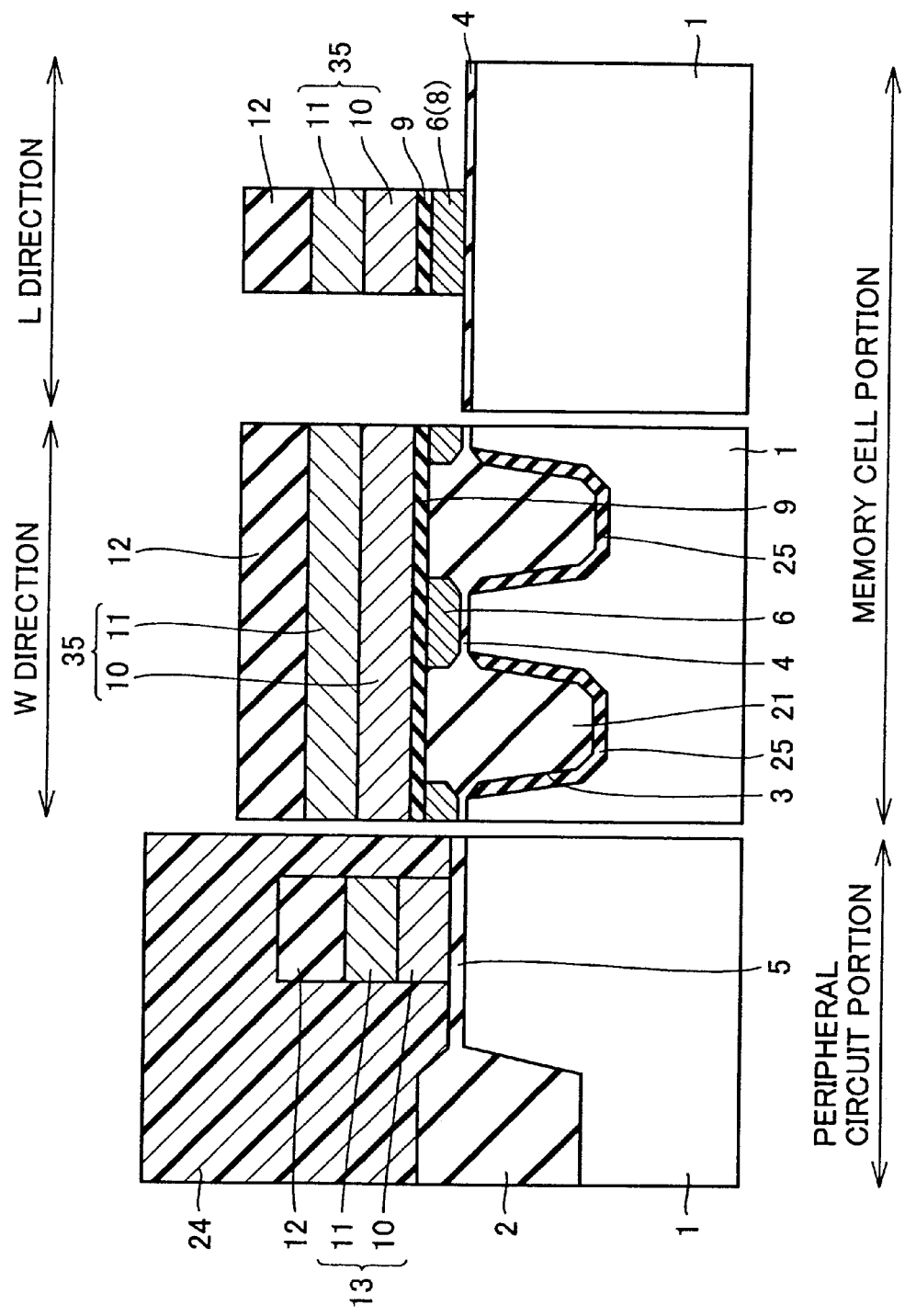

Then, as shown in FIG. 13, a photoresist 24 covering the peripheral circuit portion is formed by photolithography, and using photoresist 24 as a mask, insulating film 9 and doped polysilicon film 6 are dry-etched. Thus, floating gate electrode 8 in the memory cell portion is formed.

After photolithography, phosphorus ions and arsenic ions are implanted into semiconductor substrate 1 using a photoresist (not shown) as a mask to form a drain of the memory cell transistor.

Further photolithography is performed, and with the peripheral circuit portion and the drain of the memory cell transistor covered with a photoresist (not shown), the silicon oxide film 21 on the source side of the memory cell transistor is removed by dry-etching in self-alignment with control gate electrode 35. Then, phosphorus ions and arsenic ions are implanted into semiconductor substrate 1 to form a source of the memory cell transistor.

Further photolithography is performed, and using a photoresist (not shown) as a mask, phosphorus ions and arsenic ions are implanted into semiconductor substrate 1 to form a source/drain of an n-channel transistor in the peripheral circuit portion.

Further photolithography is performed, and using a photoresist (not shown) as a mask, boron ions or $BF_2$ ions are implanted into semiconductor substrate 1 to form a source/drain of a p-channel transistor in the peripheral circuit portion.

Then, interlayer insulating film 14 formed of a silicon oxide film or the like is deposited to cover the transistor in the peripheral circuit portion and the memory cell transistor. Photolithography is performed, and using a photoresist (not shown) as a mask, interlayer-insulating film 14 is dry-etched to form contact hole 15.

Then, after deposition of tungsten (W) of about 500 nm, etch-back is performed to form a W plug 16. Then, on interlayer insulating film 14, an Al—Cu film is deposited, photolithography is performed, and using a photoresist (not shown) as a mask, the Al—Cu film is dry-etched. This forms an interconnection film 17.

Through the above steps, the non-volatile semiconductor memory device shown in FIG. 1 is completed.

(Second Embodiment)

Figure 14:
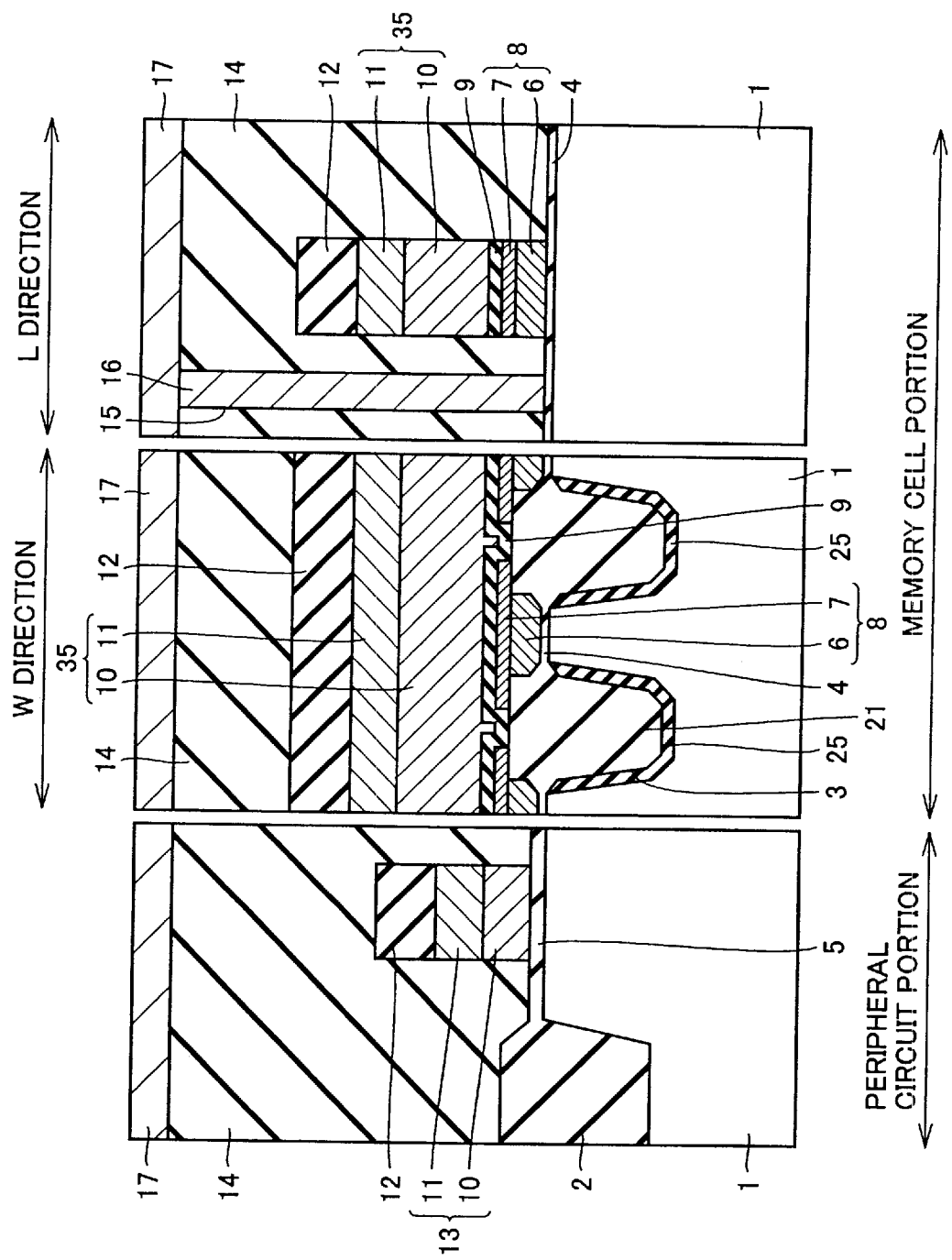
FIG. 14 is a cross-sectional view of a non-volatile semiconductor memory device in accordance with a second embodiment of the present invention.
Figure 15:
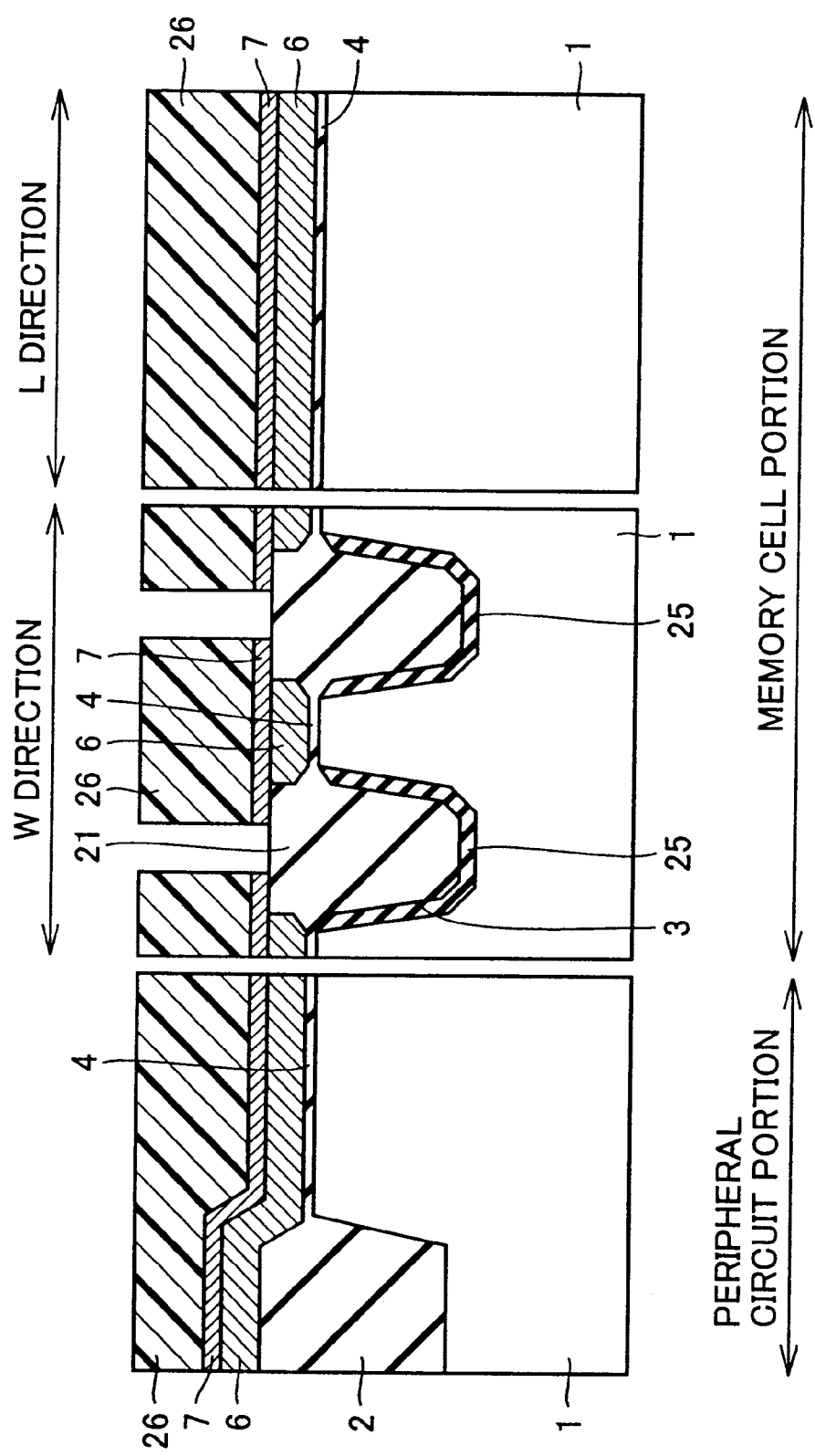
FIG. 15 is a cross-sectional view of a characteristic step in manufacturing the non-volatile semiconductor memory device shown in FIG. 14.

Referring now to FIGS. 14 and 15, a second embodiment of the present invention will be described. FIG. 14 is a cross-sectional view of a non-volatile semiconductor memory device in accordance with the present embodiment.

As shown in FIG. 14, in the non-volatile semiconductor memory device in accordance with the present embodiment, floating gate electrode 8 is formed of a doped polysilicon film 6 about 100 nm thick, and a doped polysilicon film (conductive film) 7 about 50 nm thick formed on doped polysilicon film 6. Except for this point, the structure is similar to the first embodiment, and the corresponding description thereof will not be repeated.

Since floating gate 8 has a stacked structure of conductive films, these can be formed while a good state of interface with other elements in contact with doped polysilicon films 6 and 7 is kept. Furthermore, by adjusting properly the concentration of the impurity introduced in doped polysilicon films 6 and 7, a desired resistance value of floating gate electrode 8 can be attained.

Still further, a desired thickness of doped polysilicon films 6 and 7 can be attained, and each can be formed easily.

In addition, since doped polysilicon film 7 extends over silicon oxide film 21, the surface area of doped polysilicon film 7 can be made greater than the surface area of doped polysilicon film 6. Thus, the surface area of floating gate electrode 8 can be increased, and therefore the coupling ratio of floating gate electrode 8 to control gate electrode 35 can be enhanced.

Referring now to FIG. 15, a method of manufacturing the non-volatile semiconductor memory device in accordance with the present embodiment will be described.

First, through the step similar to the first embodiment, the surface of doped polysilicon film 6 is exposed. Doped polysilicon film 7 is deposited on this doped polysilicon film 6 by CVD or the like.

At this point, the concentration of the impurity contained in doped polysilicon film 6 is differentiated from the concentration of the impurity contained in the doped polysilicon film 7. Specifically, the concentration of the impurity contained in doped polysilicon film 6 is kept low, while the concentration of the impurity contained in doped polysilicon film 7 is made higher than that.

Accordingly, doped polysilicon film 6 can be formed while a good state of an interface between doped polysilicon film 6 and the underlying layer can be kept, and the resistance of floating gate electrode 8 can be lowered.

After photolithography, on doped polysilicon film 7, a photoresist 26 is formed and using this photoresist 26 as a mask, doped polysilicon film 7 is etched. Therefore, doped polysilicon film 7 is formed to extend over silicon oxide film 21.

It is noted that by making the thickness of doped polysilicon film 7 smaller than the thickness of doped polysilicon film 6, doped polysilicon film 7 can be patterned easily even on a thin underlying film.

After patterning of doped polysilicon film 7 in the above stated manner, photoresist 26 is removed. Thereafter, the steps similar to the first embodiment follow to form the non-volatile semiconductor memory device shown in FIG. 14.

(Third Embodiment)

Figure 16:
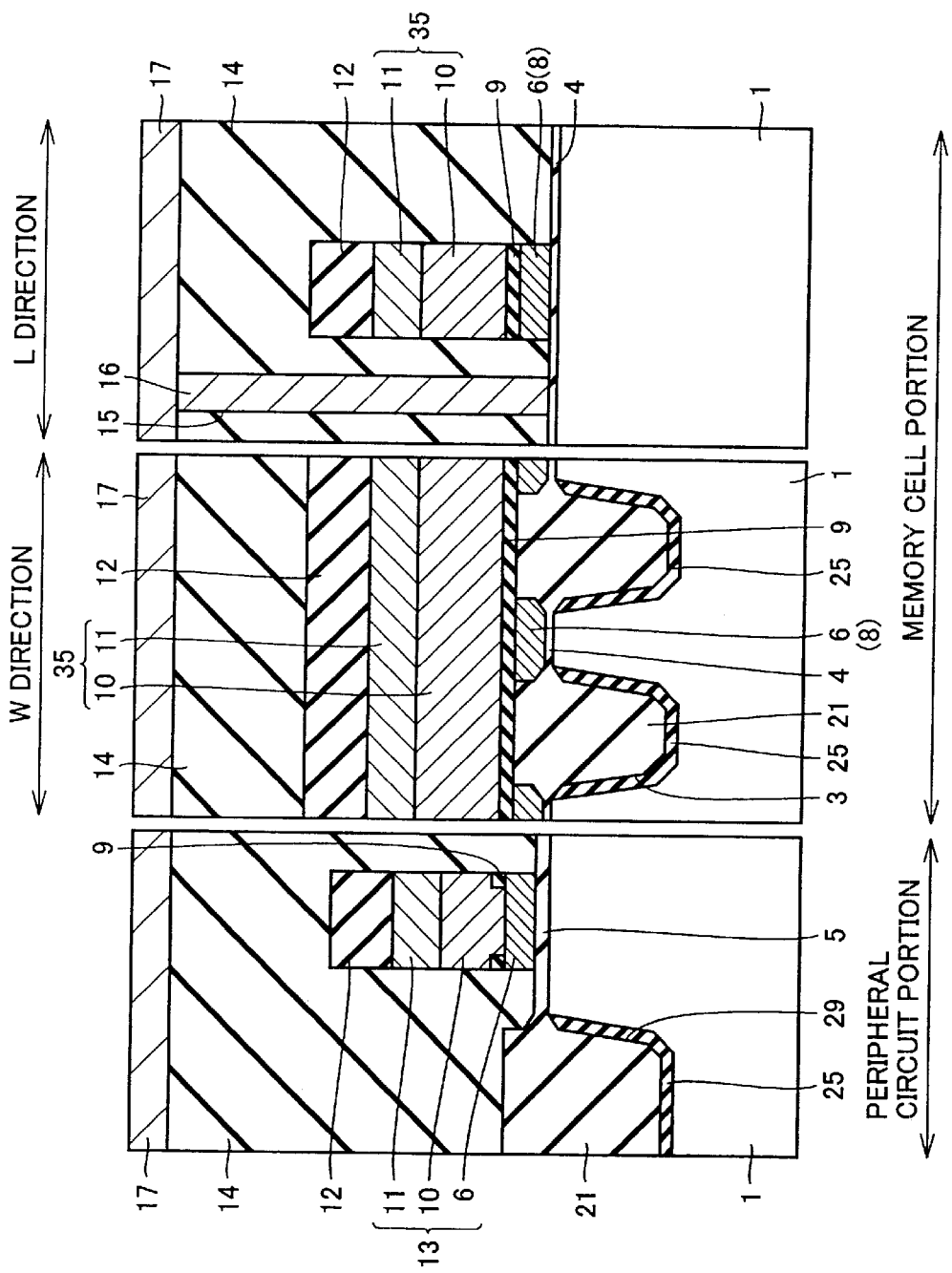
FIG. 16 is a cross-sectional view of a non-volatile semiconductor memory device in accordance with a third embodiment of the present invention.

Referring now to FIGS. 16 to 27, a third embodiment of the present invention will be described. FIG. 16 is a cross-sectional view of a nonvolatile semiconductor memory device in accordance with the present embodiment.

As shown in FIG. 16, in the non-volatile semiconductor memory device in accordance with the present embodiment, in the peripheral circuit portion there is provided a trench 29, in which silicon oxide film 21 is formed, and gate electrode 13 of the transistor in the peripheral circuit portion has a stacked structure including doped polysilicon films 6 and 10 and WSi film 11.

Further, nitrided silicon layer 25 is formed along the wall surface of trench 29, and the thickness of thermal oxide film (insulating film) 5 located on this nitrided silicon layer 25 is made equal to or larger than the thickness of thermal oxide film 5 located at the periphery of nitrided silicon layer 25.

Except this point, the structure is similar to that of the first embodiment, and the corresponding description thereof will not be repeated.

The present embodiment also has a structure basically similar to the first embodiment, and therefore the effect similar to the first embodiment can be attained. In addition to that, according to the present embodiment, since nitrided silicon layer 25 is formed additionally in the trench isolation region in the peripheral circuit portion, the increase in crystal defect density in semiconductor substrate 1 located within the peripheral circuit portion can also be prevented.

Furthermore, also in the peripheral circuit portion, the thickness of thermal oxide film 5 located on the nitrided silicon layer 25 is made equal to or larger than the thickness of thermal oxide film 5 located at the periphery of nitrided silicon layer 25, so that the electric characteristics and reliability of the elements can be improved also in the peripheral circuit portion.

Referring now to FIGS. 17 to 27, a method of manufacturing the nonvolatile semiconductor memory device in accordance with the third embodiment will be described.

Figure 17:
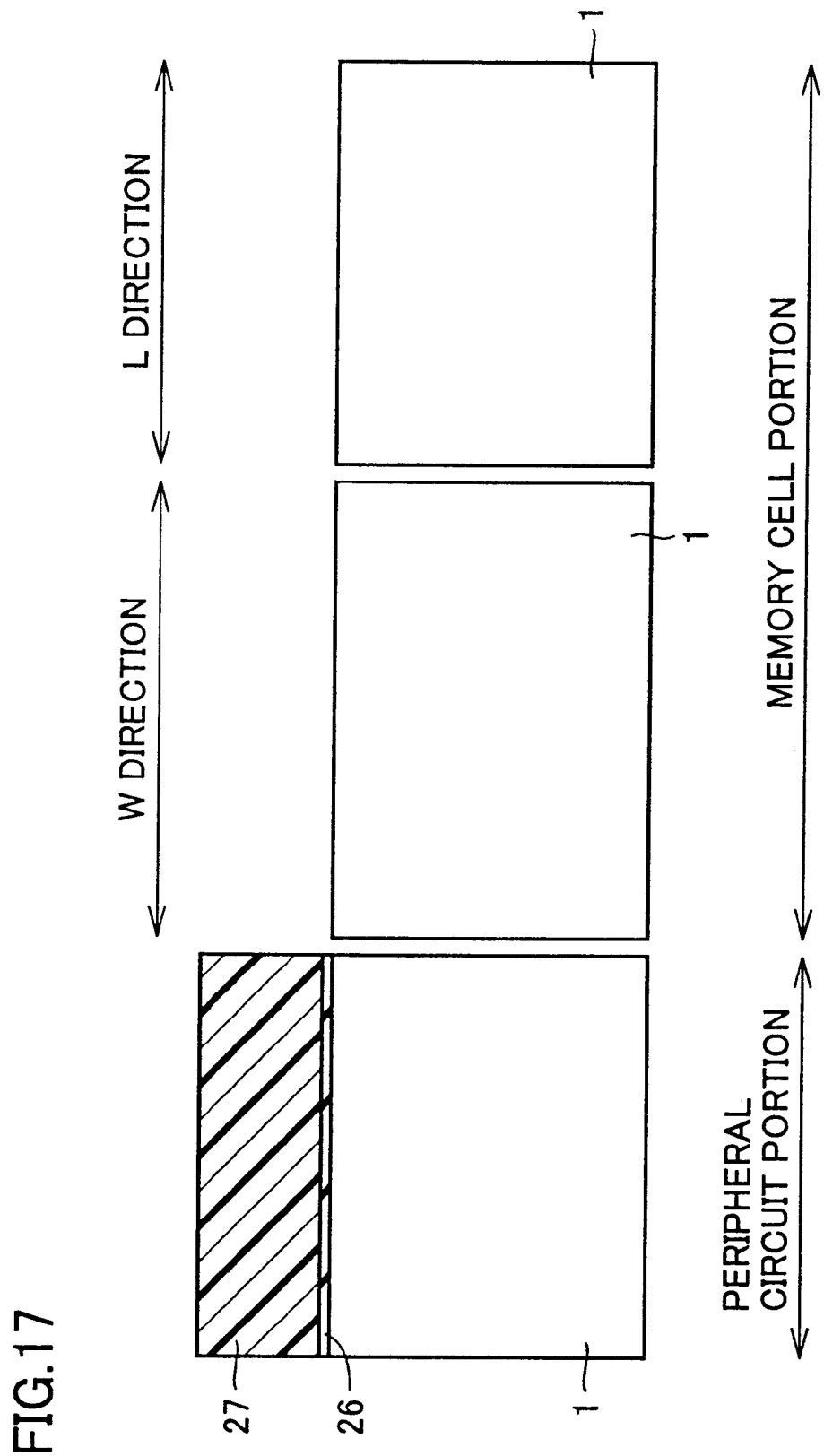
FIGS. 17 to 27 are cross-sectional views showing first to eleventh steps of manufacturing the non-volatile semiconductor memory device shown in FIG. 16.

An n-well region and a p-well region in semiconductor substrate 1 in advance, and thereafter, a thermal oxide film 26 of about 10 nm is formed. A photoresist 27 covering the peripheral circuit portion is formed by photolithography on thermal oxide film 26, which is selectively removed by hydrofluoric acid using photoresist 27 as a mask, as shown in FIG. 17.

After removal of photoresist 27, thermal oxide film 4 of about 10 nm is formed, which will serve as a tunnel insulating film of memory cell portion. At this point, in the peripheral circuit portion, thermal oxide film 26 is subjected to further oxidation, resulting in formation of thermal oxide film 5 thicker than thermal oxide film 4. This thermal oxide film 5 will function as the gate insulating film of the transistor in the peripheral circuit portion.

Figure 18:
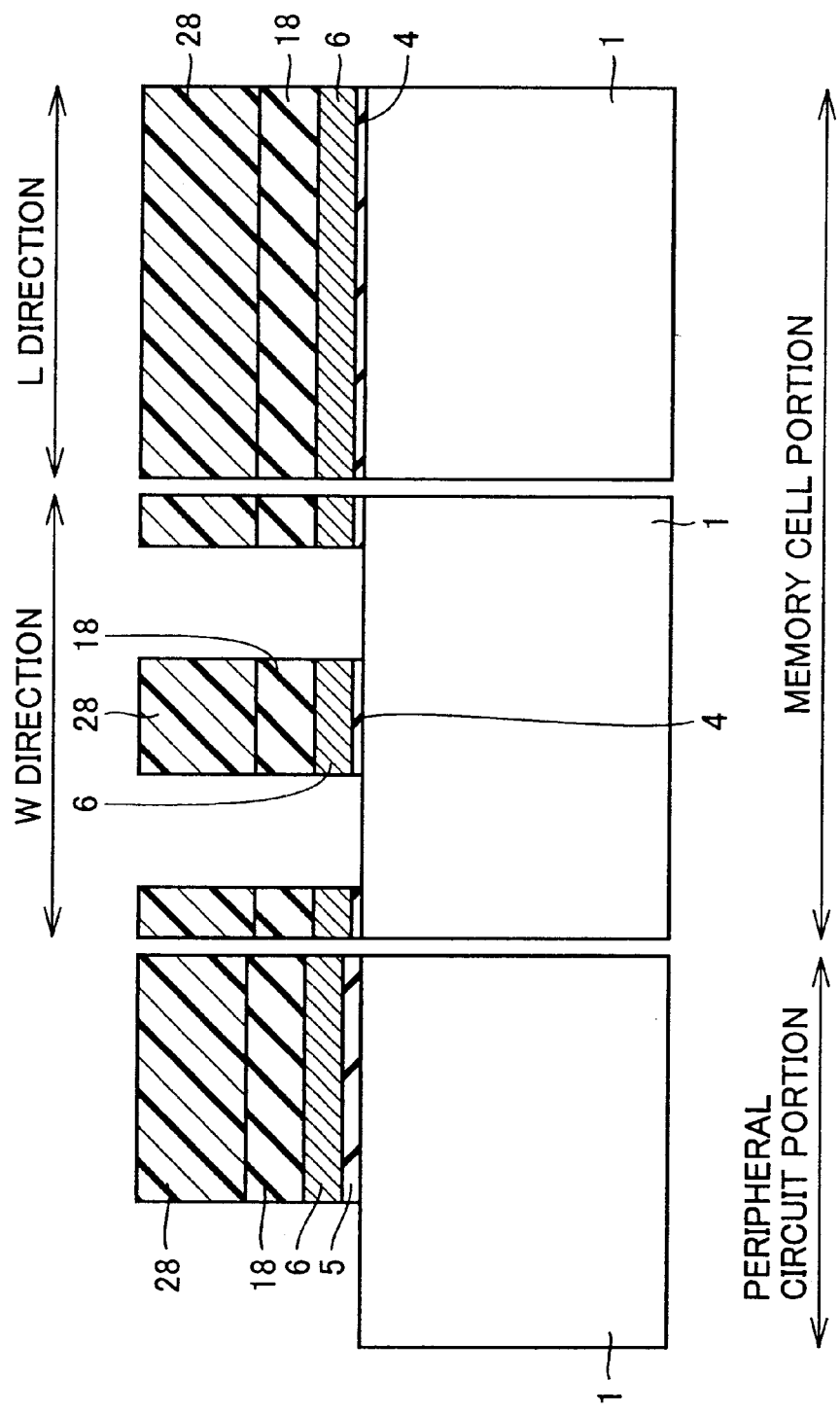

Next, doped polysilicon film 6 and silicon nitride film 18 are deposited by a technique similar to the first embodiment, and a photoresist 28 in a predetermined shape is formed on silicon nitride film 18 by photolithography. As shown in FIG. 18, using this photoresist 28 as a mask, silicon nitride film 18, doped polysilicon film 6, thermal oxide film 4 and thermal oxide film 5 are dry-etched. Thus, a region where the trench for element-isolation is to be formed is exposed in the memory cell portion and the peripheral circuit portion.

Figure 19:
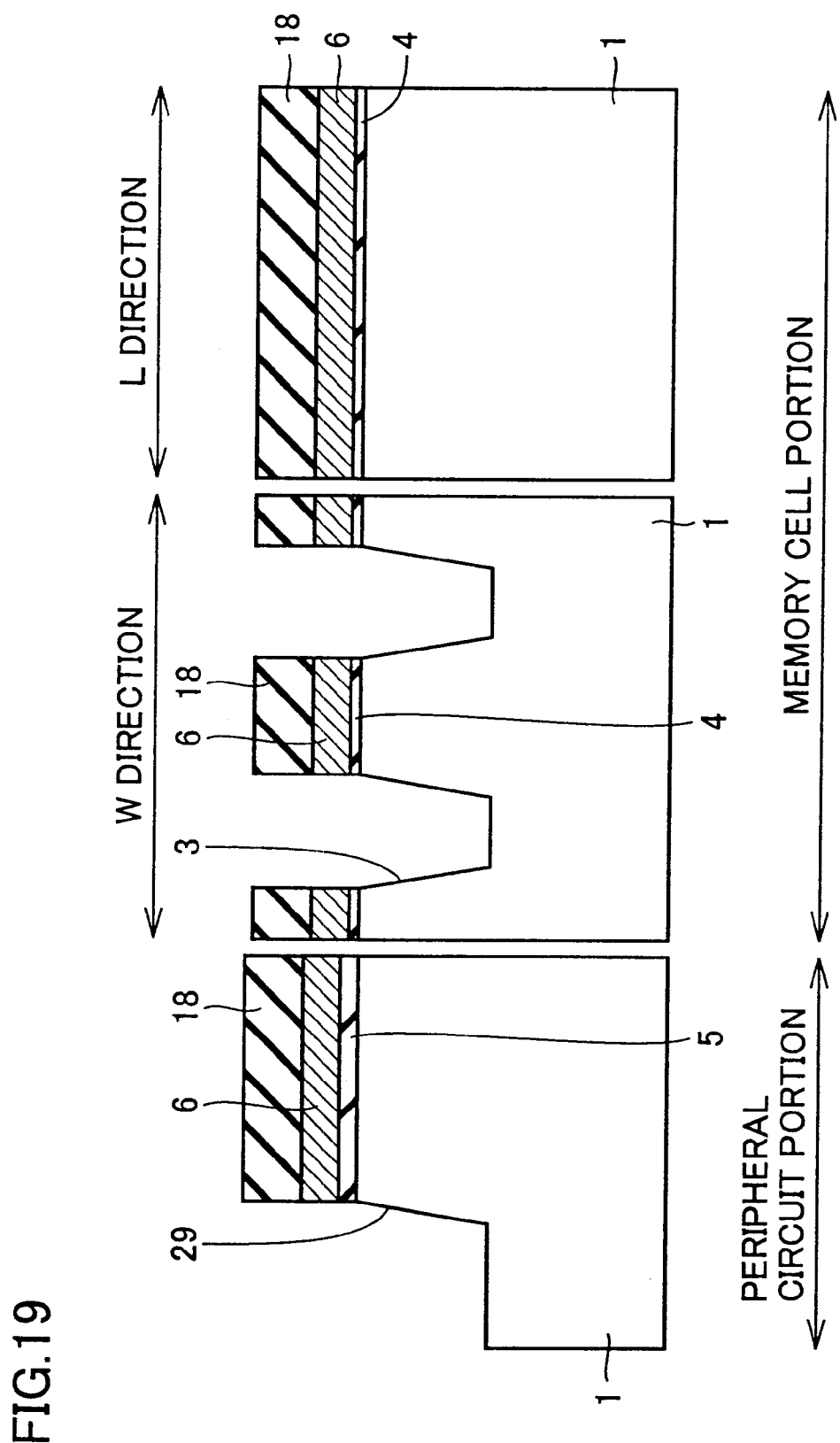

After removal of photoresist 28, using the patterned silicon nitride film 18, doped polysilicon film 6, thermal oxide film 4 and thermal oxide film 5 as a mask, semiconductor substrate 1 is dry-etched. This forms trenches 3 and 29 each having a depth of about 400 nm as shown in FIG. 19.

The formation of trenches 3 and 29 in the memory cell portion and the peripheral circuit portion through the same steps in this manner can simplify the process.

Figure 20:
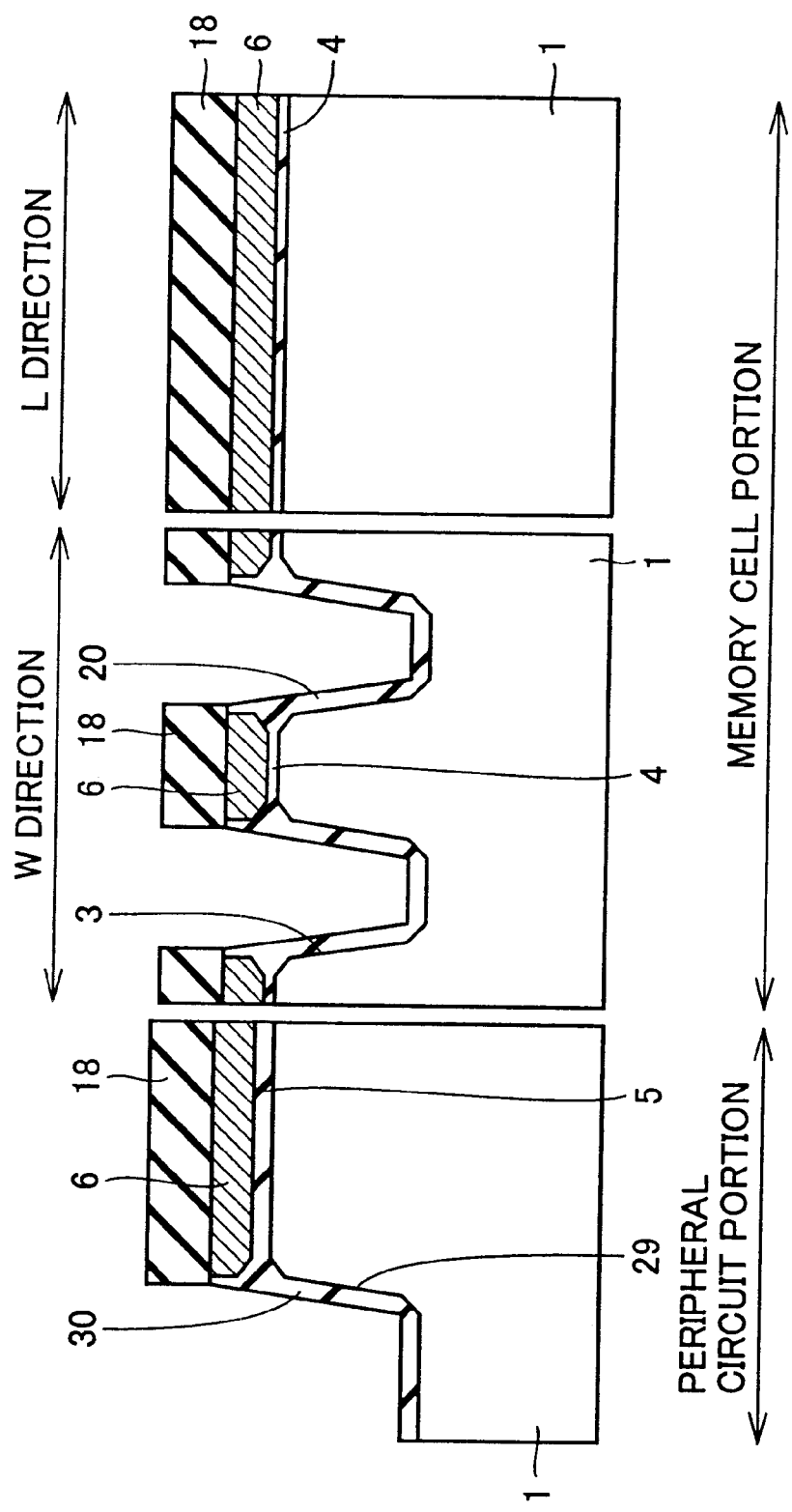
Figure 21:
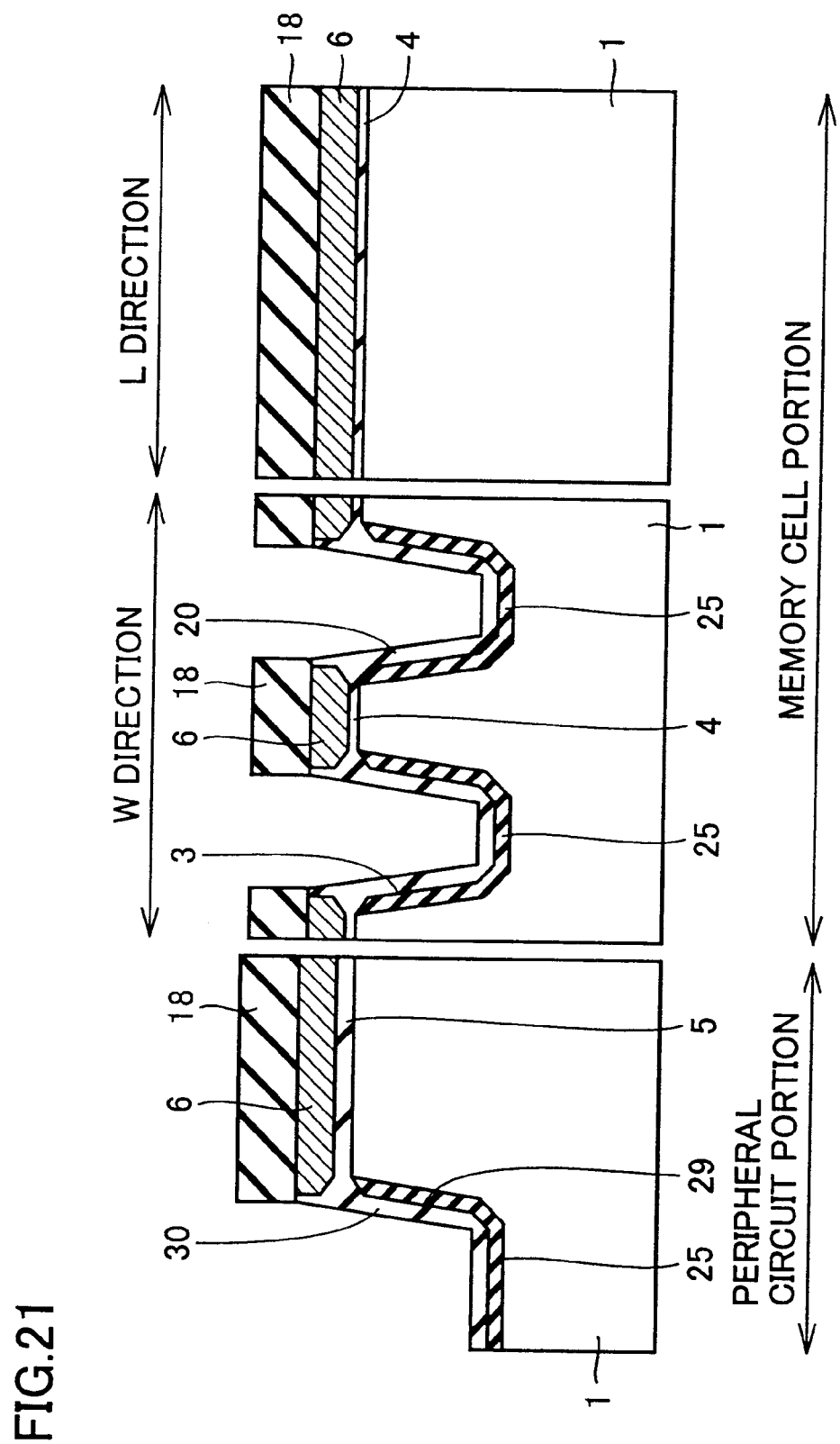

Then, as shown in FIG. 20, the inner walls of trenches 3 and 29 are oxidized by about 50 nm to form thermal oxide films 20 and 30. In this state, the inner walls of trenches 3 and 29 are nitrided by a technique similar to the first embodiment. Thus, as shown in FIG. 21, nitrided silicon layer 25 is formed both in the memory cell portion and in the peripheral circuit portion.

Also in the present embodiment, since thermal oxide films 4 and 5 have been already formed before formation of nitrided silicon layer 25, thermal oxide films 4 and 5 are not locally thinned at the field edge, as seen in the conventional example.

Figure 22:
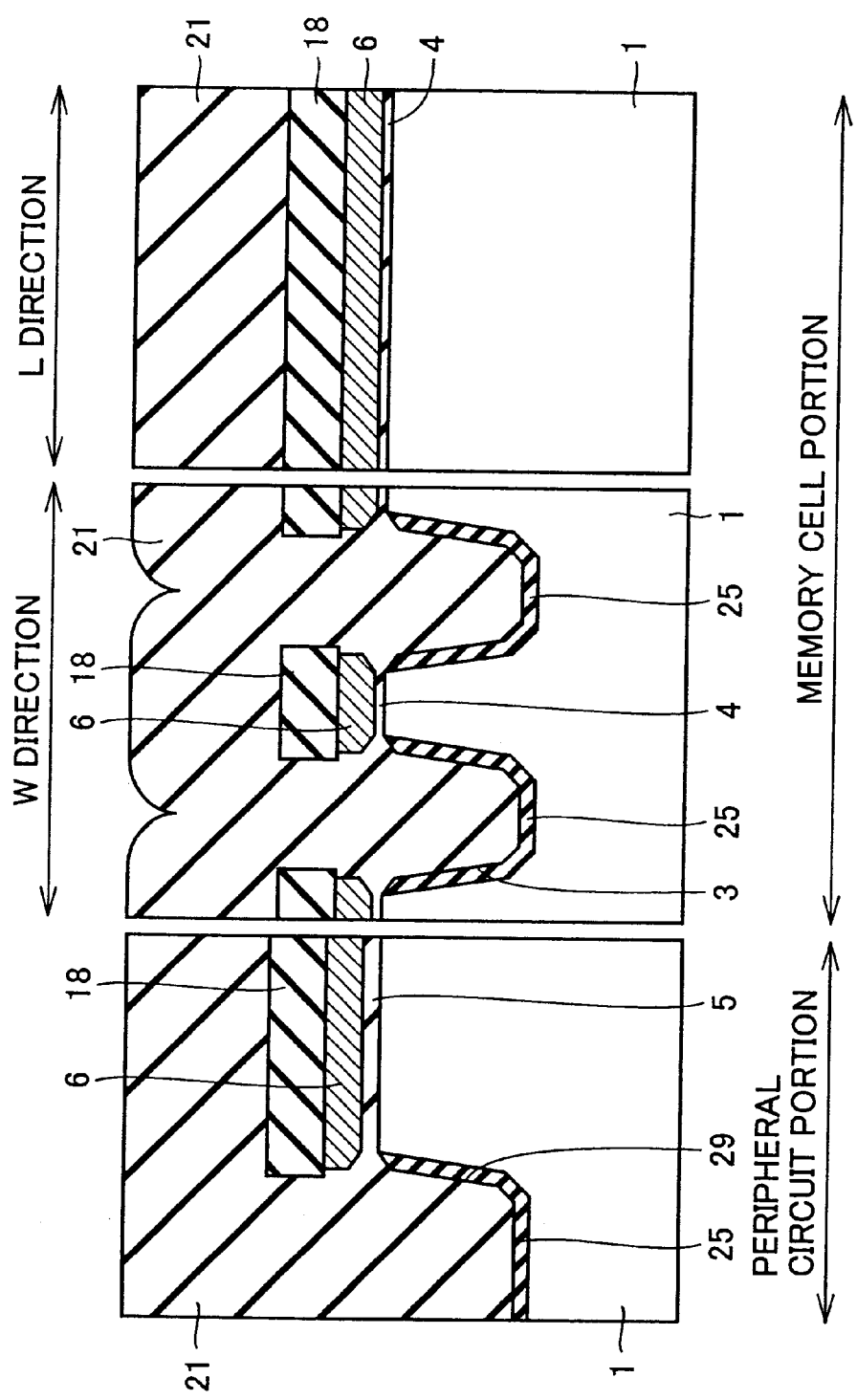
Figure 23:
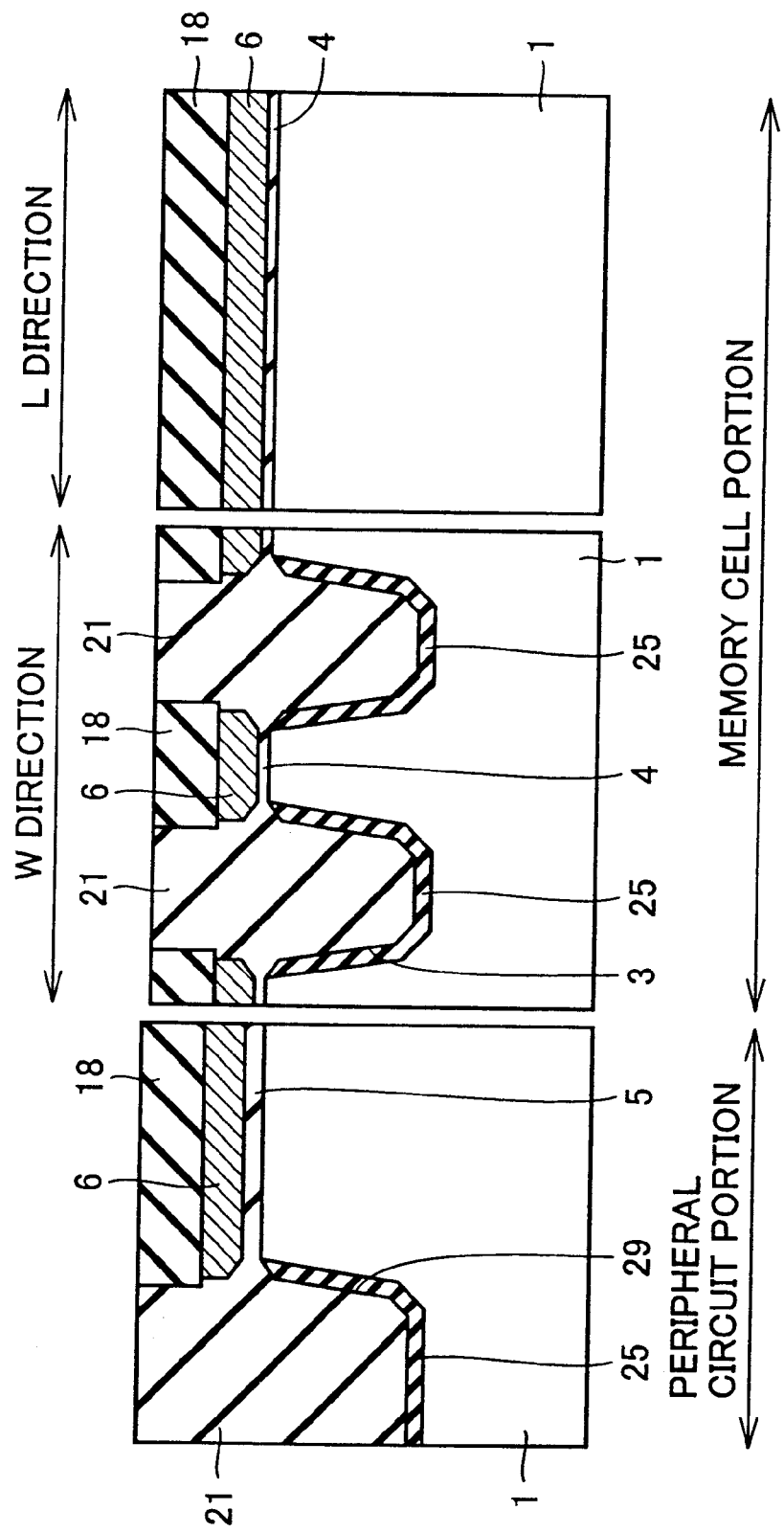

Thereafter, as shown in FIG. 22, silicon oxide film 21 of about 500 nm is deposited to fill in the trenches 3 and 29. Then, similar to the first embodiment, silicon oxide film 21 undergoes CMP to expose silicon nitride film 18 as shown in FIG. 23.

Figure 24:
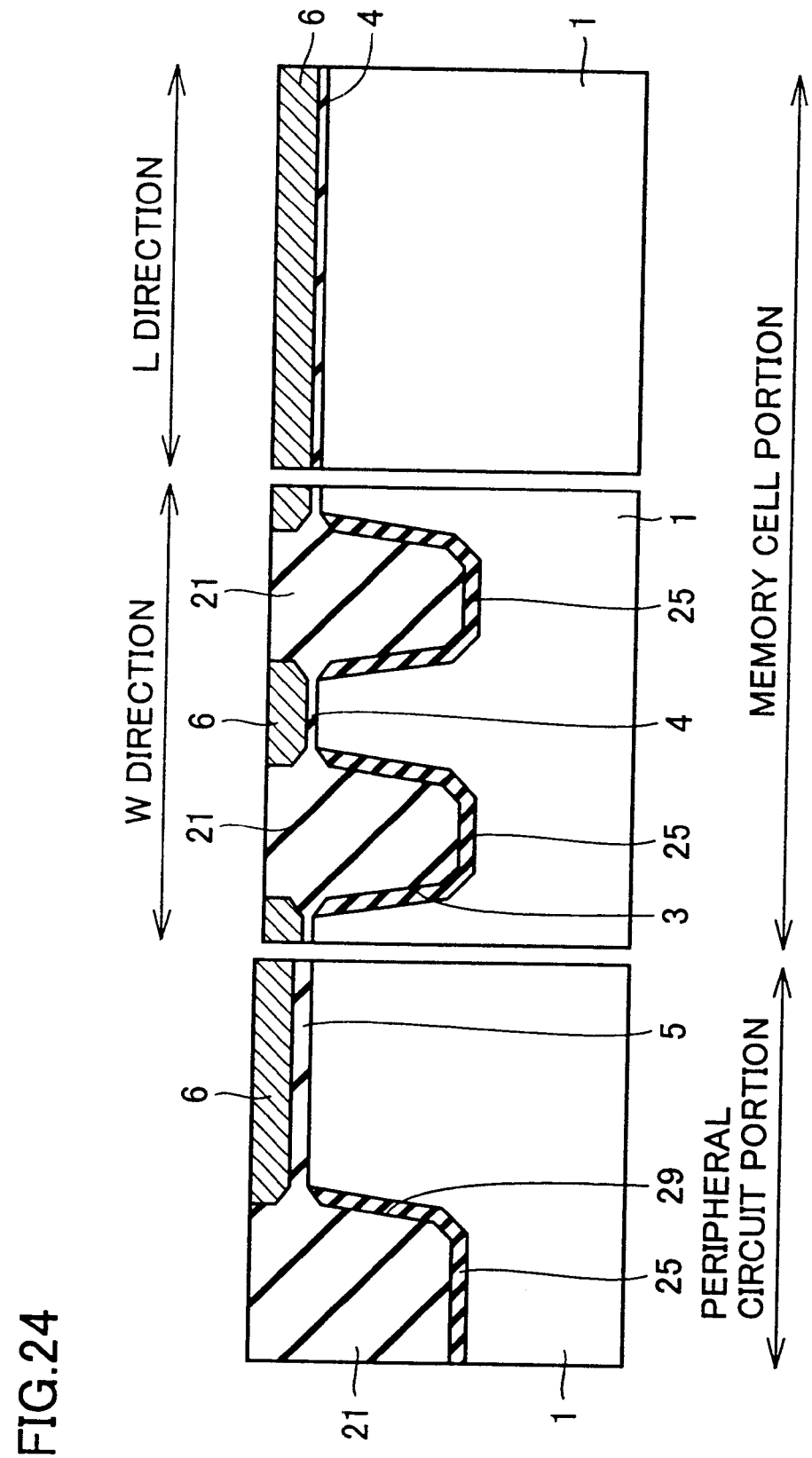

Then, silicon oxide film 21 is dry-etched with hydrofluoric acid by a predetermined amount, and silicon nitride film 18 is removed by hot phosphoric acid to expose the surface of doped polysilicon film 6. The Shallow Trench Isolation (STI) is thus formed as shown in FIG. 24.

Figure 25:
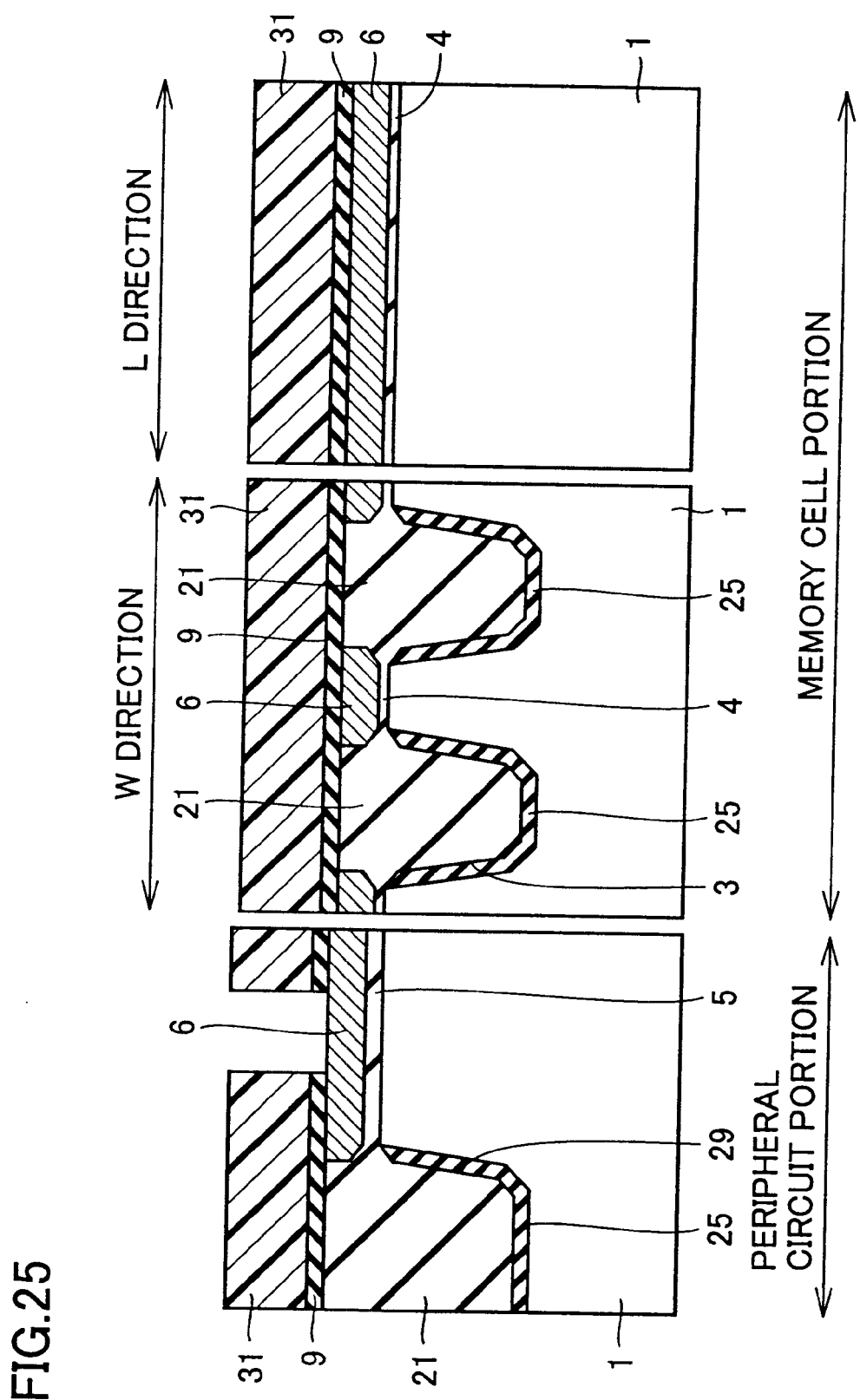

Then, insulating film 9 is formed by a technique similar to the first embodiment, and as shown in FIG. 25, photolithography is performed to form a photoresist 31 in a predetermined shape on insulating film 9. Photoresist 31 has an opening on a region where the gate electrode of the transistor in the peripheral circuit portion is to be formed. Using this photoresist 31 as a mask, insulating film 9 is dry-etched to expose the surface of doped polysilicon film 6 at the region where the gate electrode of the transistor in the peripheral circuit portion is to be formed.

Figure 26:
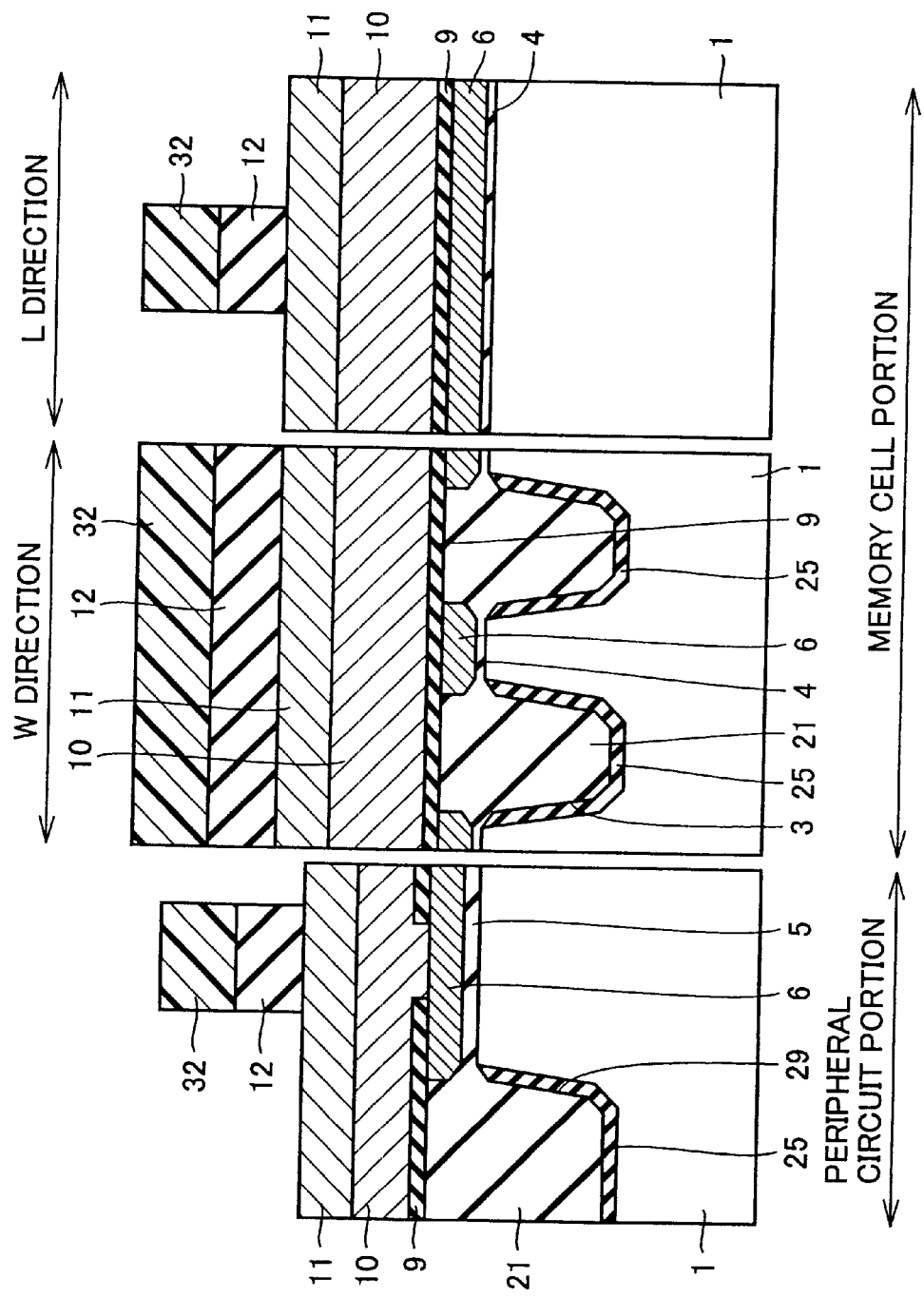

After removal of photoresist 31, doped polysilicon film 10, WSi film 11 and silicon oxide film 12 are deposited by a technique similar to the first embodiment. At this point, in the peripheral circuit portion, as shown in FIG. 26, in the region where insulating film 9 is removed, doped polysilicon film 10 and doped polysilicon film 6 are in contact and thus electrically connected, so that doped polysilicon film 6 serves as an underlayer gate electrode of the transistor in the peripheral circuit portion.

On silicon oxide film 12, a photoresist 32 in a predetermined shape is formed by photolithography, and silicon oxide film 12 is dry-etched using photoresist 32 as a mask.

Figure 27:
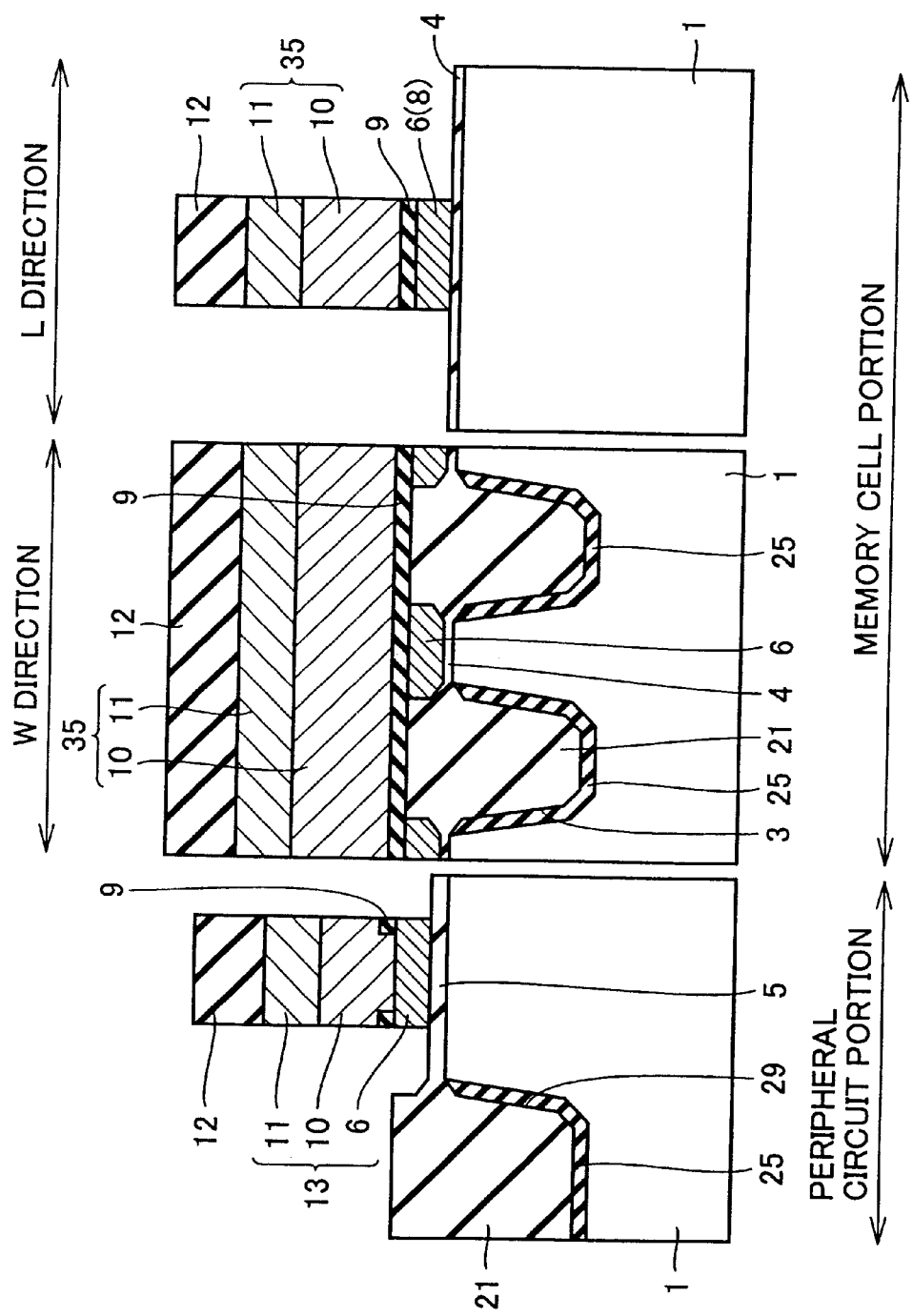

After removal of photoresist 32, as shown in FIG. 27, using the patterned polysilicon film 12 as a mask, WSi film 11, doped polysilicon film 10, insulating film 9 and doped polysilicon film 6 are dry-etched. Thus, gate electrode 13 of the transistor in the peripheral circuit portion, and control gate electrode 35 and floating gate electrode 8 are formed.

Thereafter, the steps similar to the first embodiment follow, to form the non-volatile semiconductor memory device shown in FIG. 16.

(Fourth Embodiment)

Figure 28:
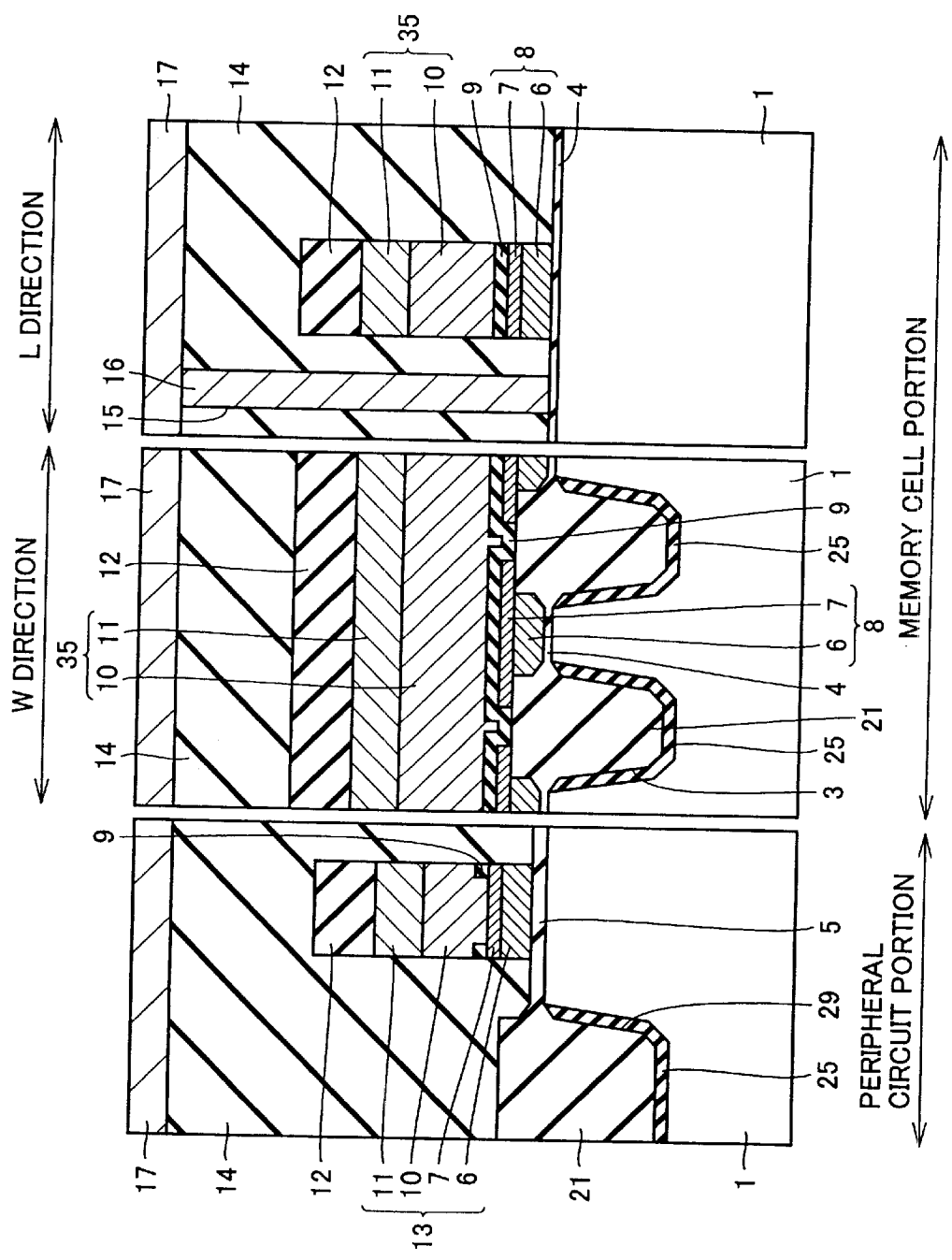
FIG. 28 is a cross-sectional view of a non-volatile semiconductor memory device in accordance with a fourth embodiment of the present invention.
Figure 29:
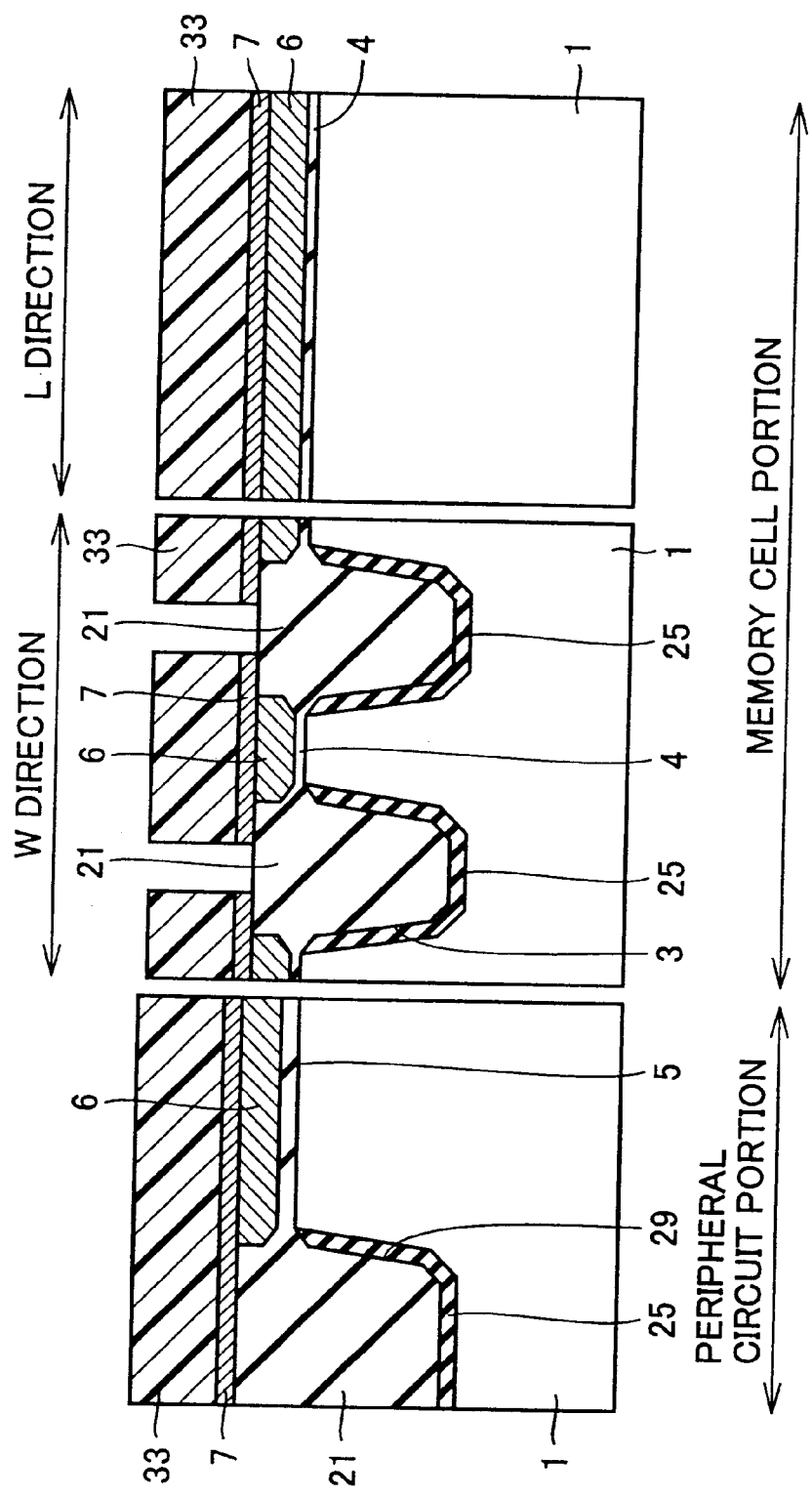
FIG. 29 is a cross-sectional view of a characteristic step in manufacturing the non-volatile semiconductor memory device shown in FIG. 28.
Figure 30:
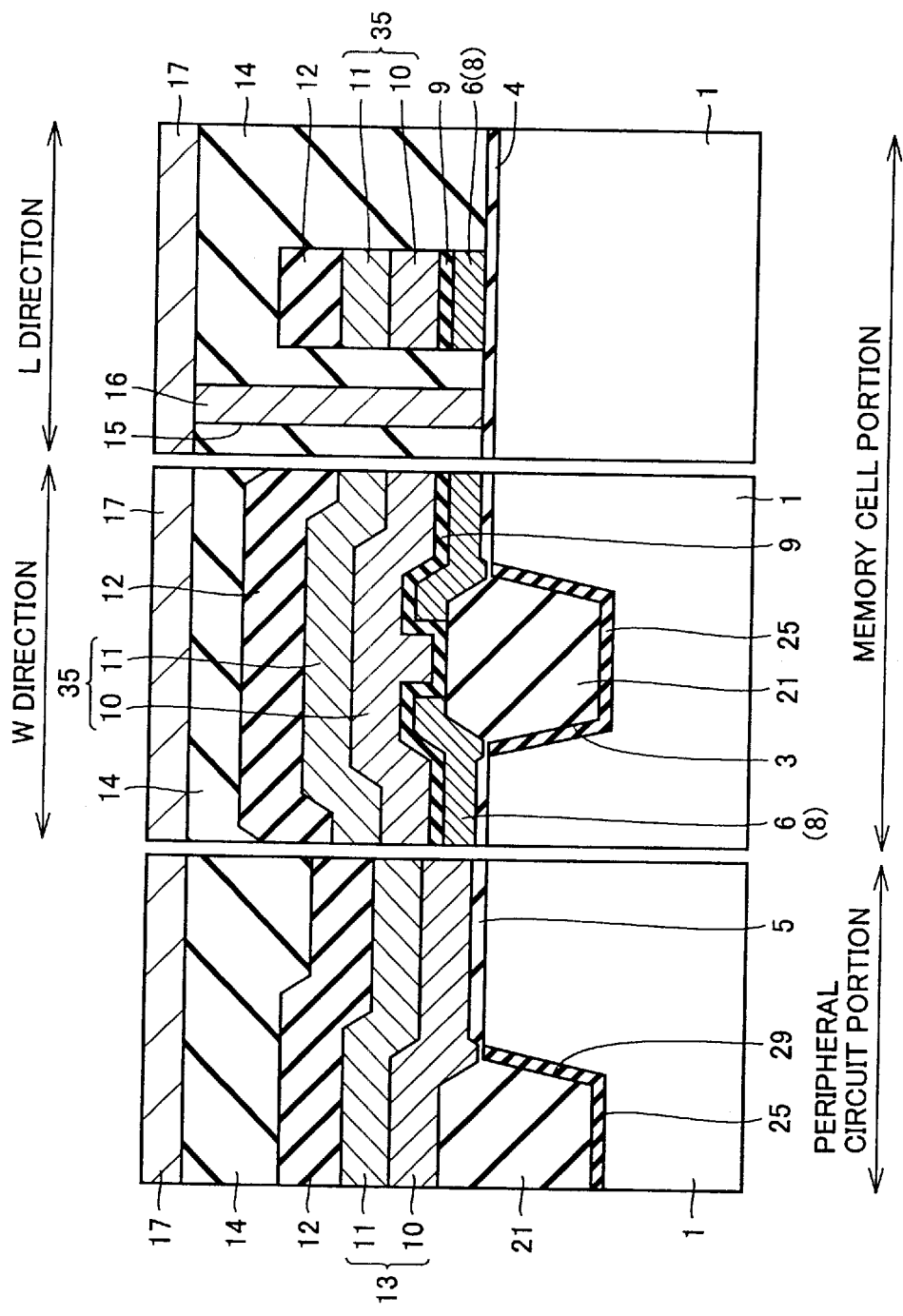
FIG. 30 is a cross-sectional view of a conventional non-volatile semiconductor memory device.
Figure 31:
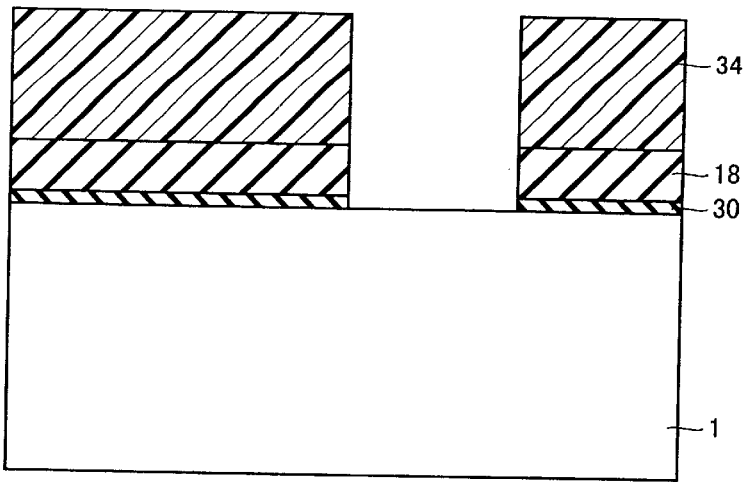
FIGS. 31 to 41 are cross-sectional views showing first to eleventh steps of manufacturing the conventional non-volatile semiconductor memory device.
Figure 32:
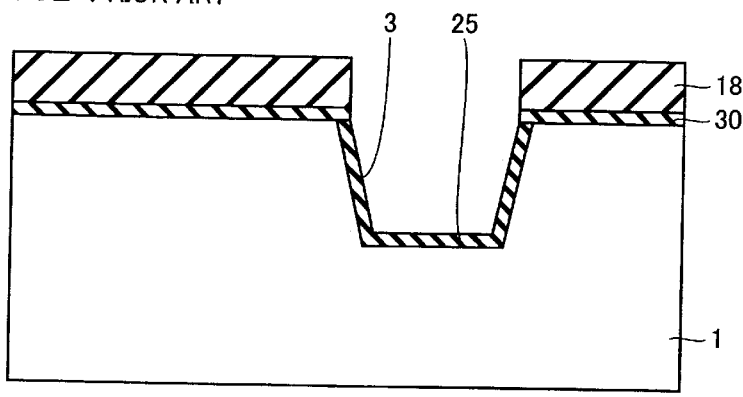
Figure 33:
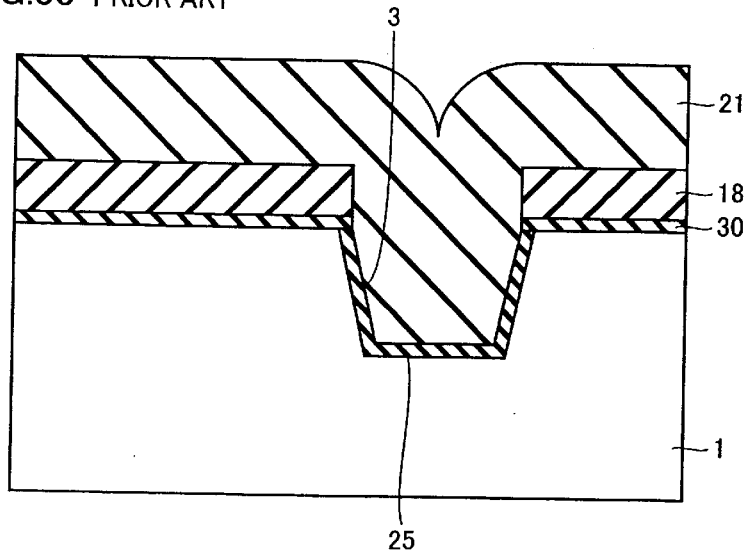
Figure 34:
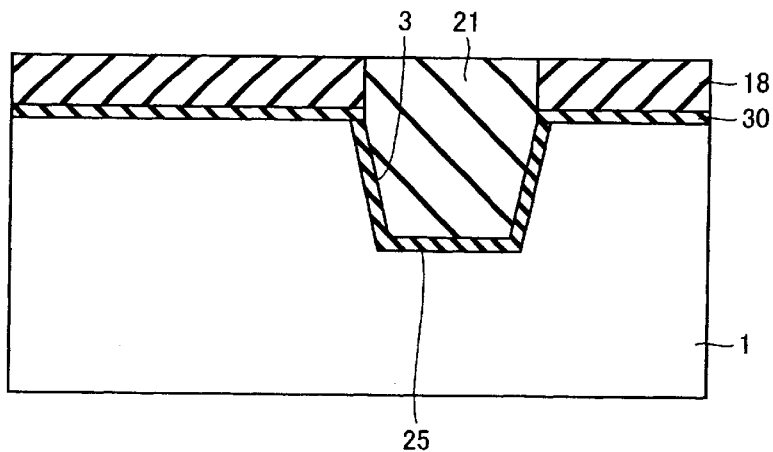
Figure 35:
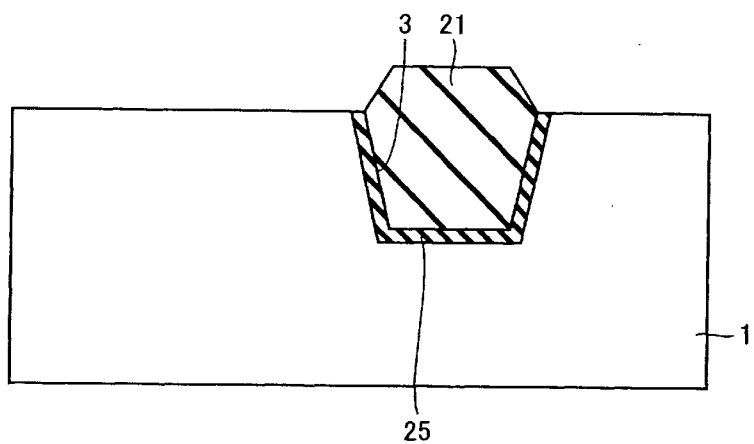
Figure 36:
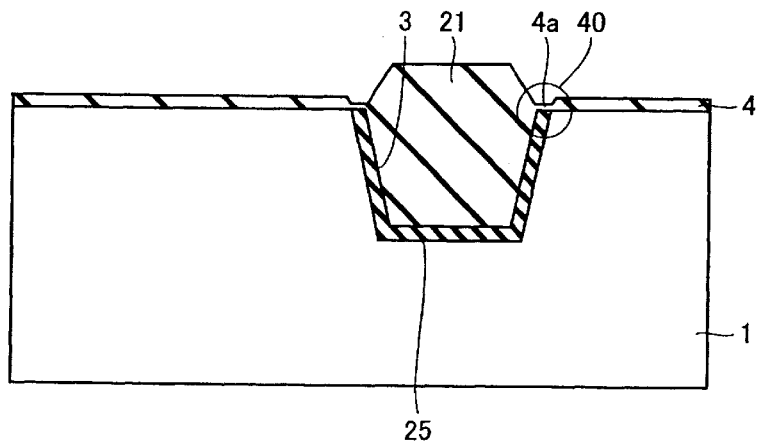
Figure 37:
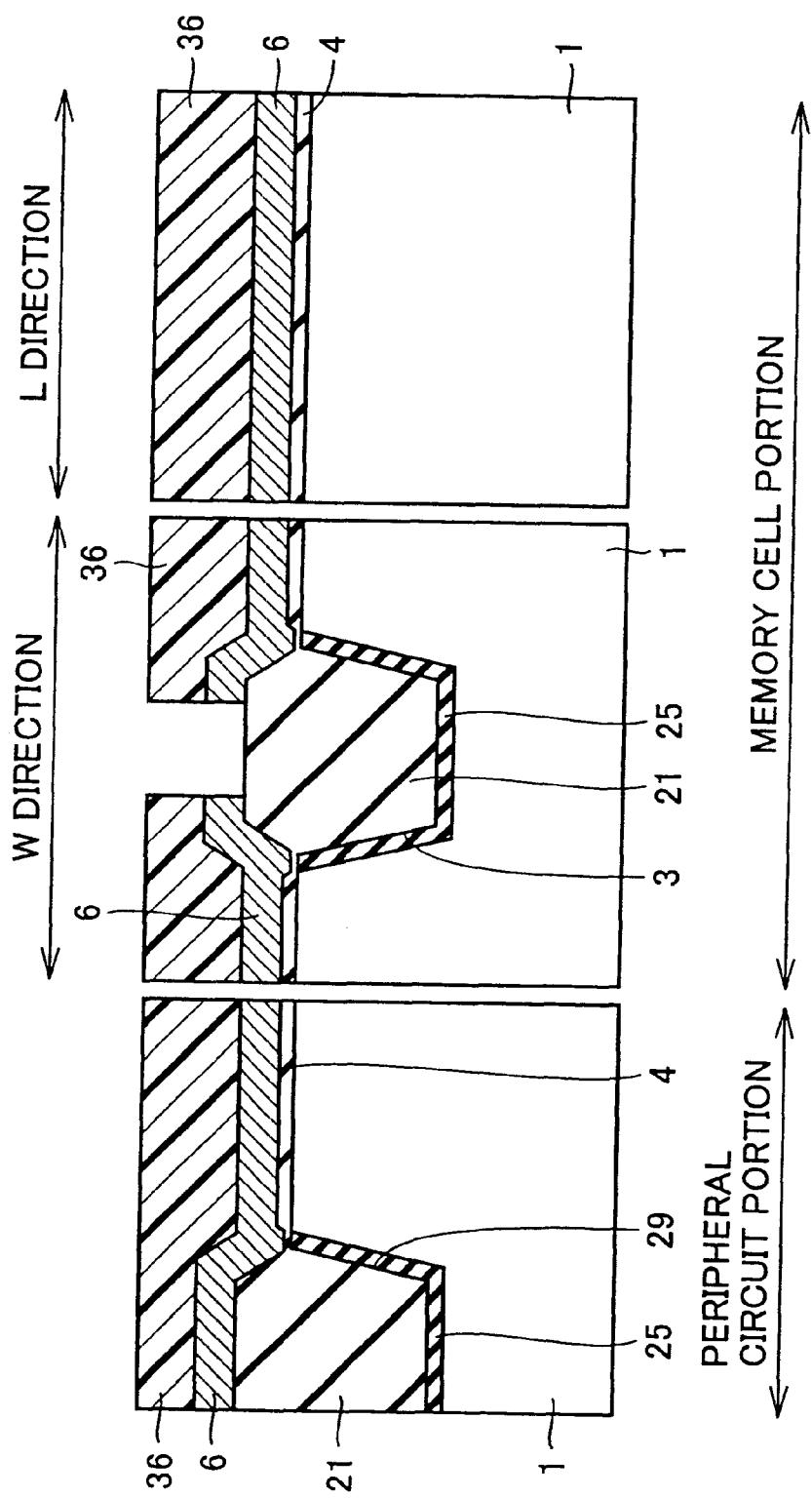
Figure 38:
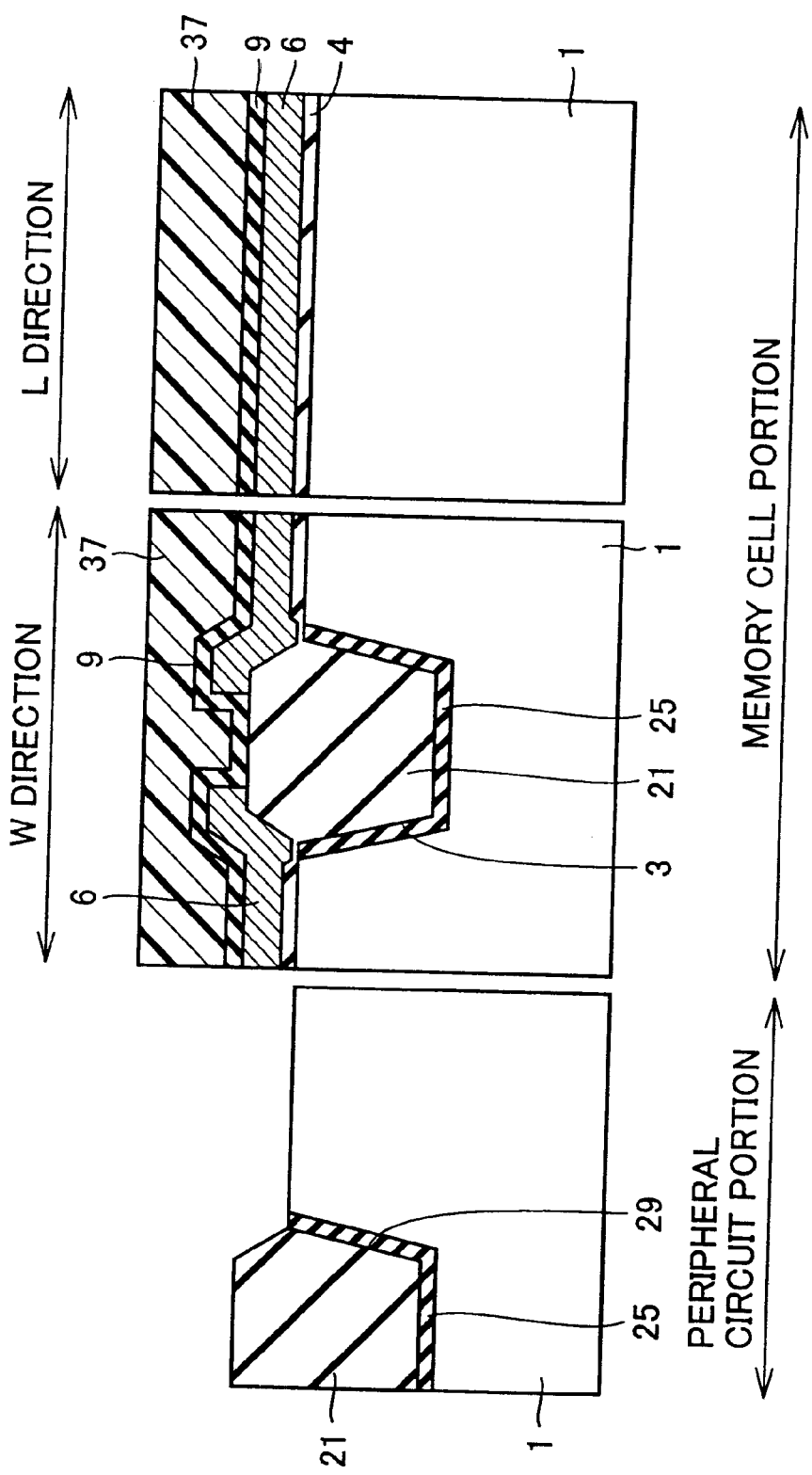
Figure 39:
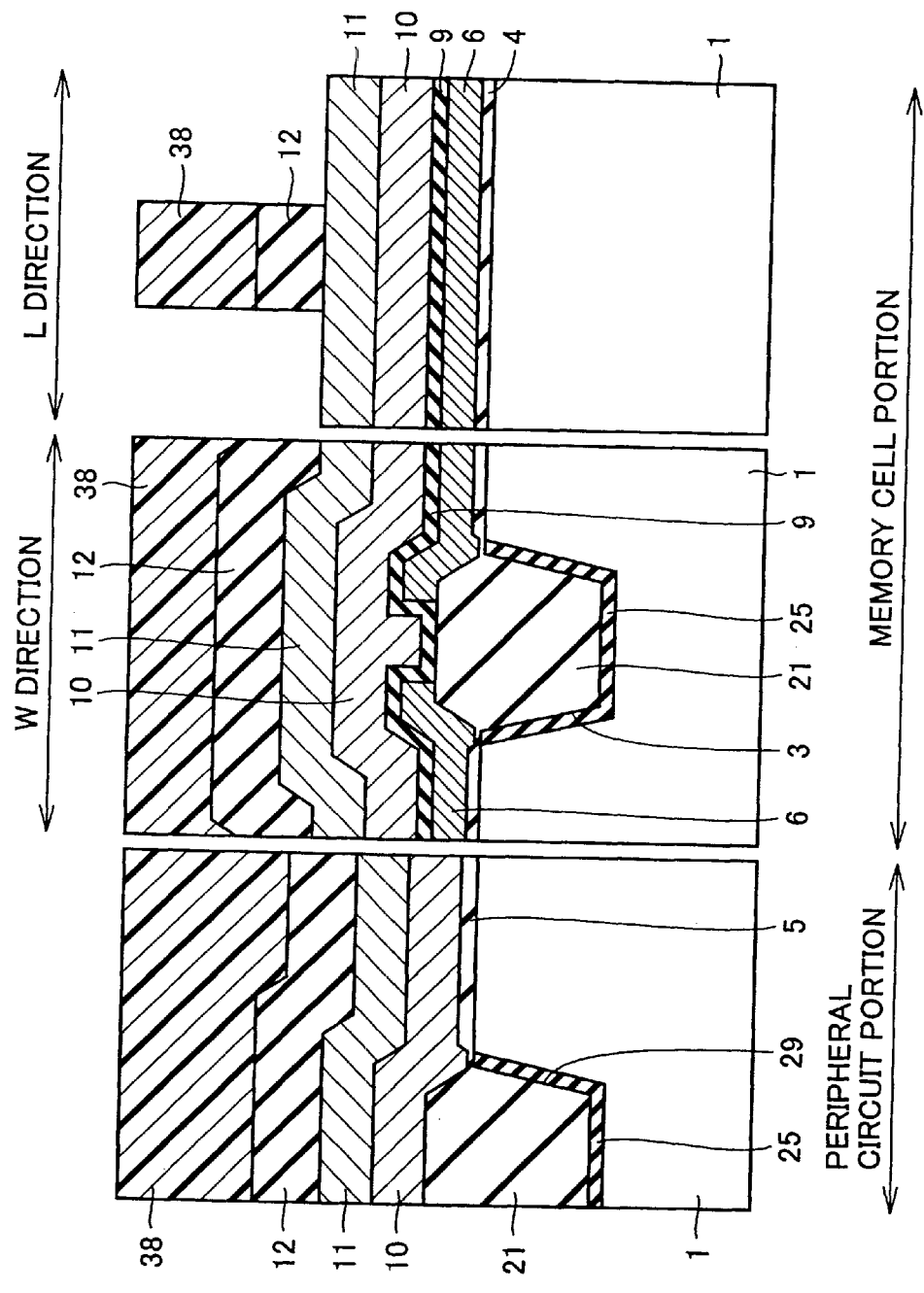
Figure 40:
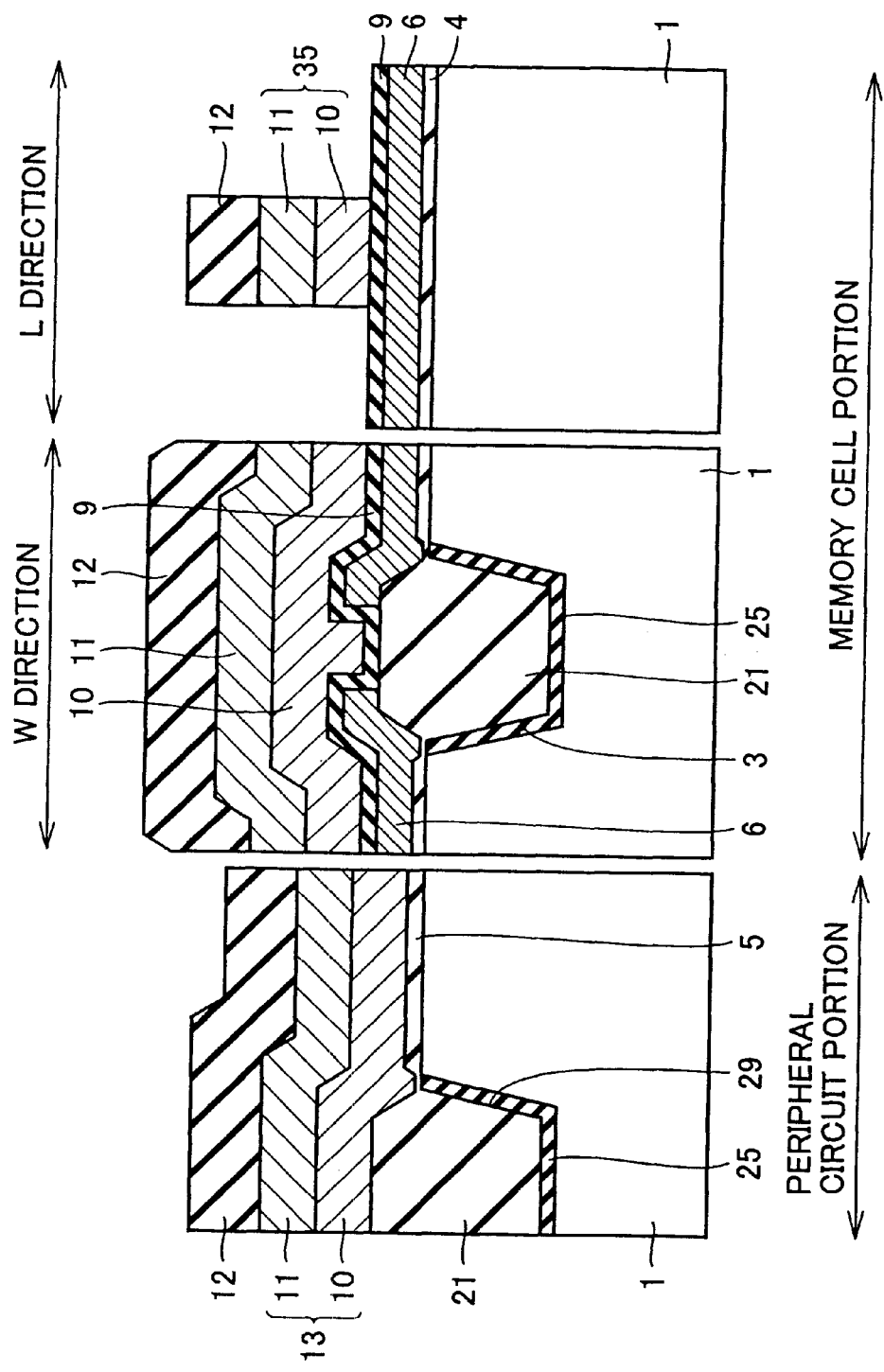
Figure 41:
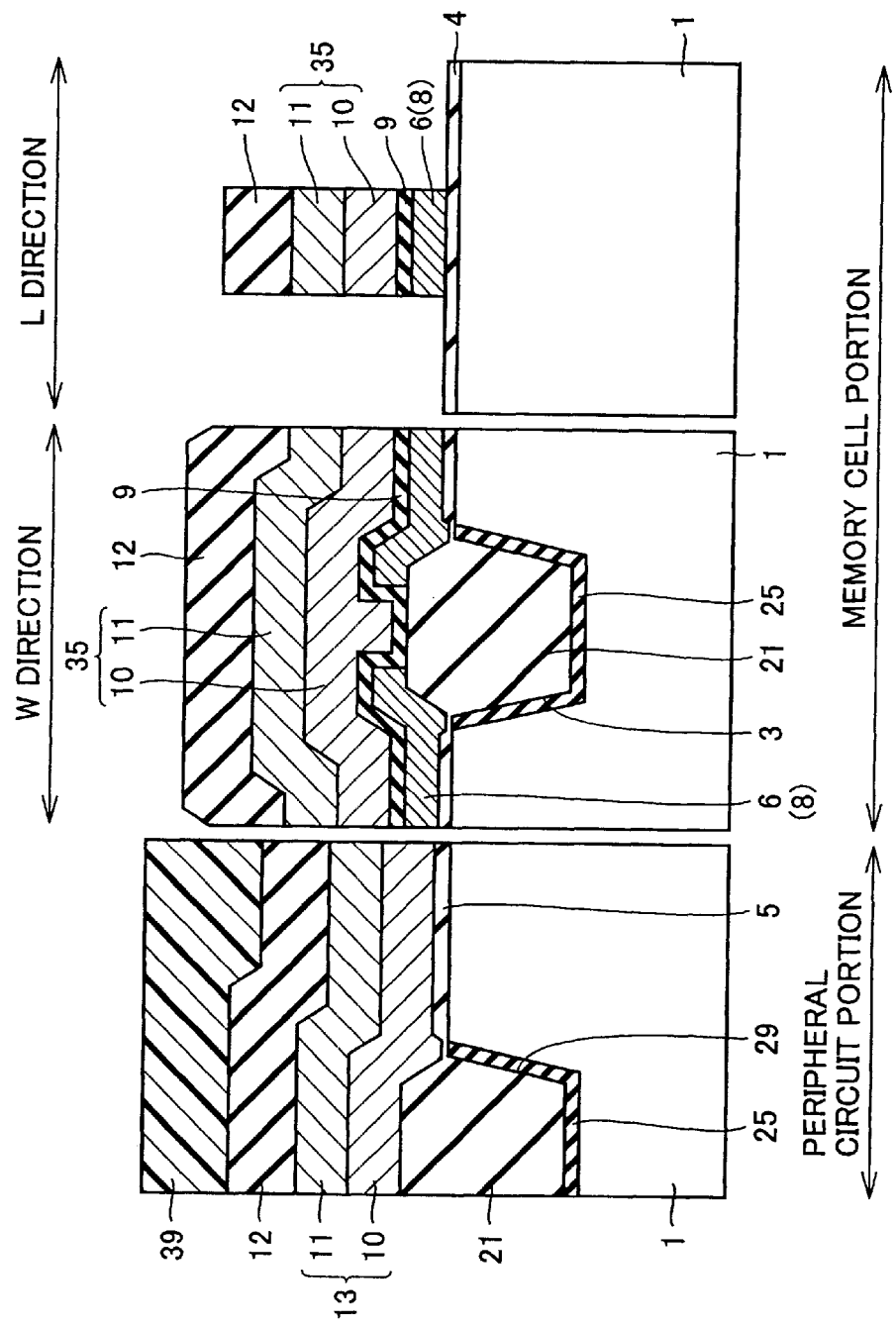

Referring now to FIGS. 28 and 29, a fourth embodiment of the present invention will be described. FIG. 28 is a cross-sectional view of a nonvolatile semiconductor memory device in accordance with the present embodiment.

As shown in FIG. 28, in the non-volatile semiconductor memory device in accordance with the present embodiment, floating gate electrode 8 is formed of doped polysilicon film 6 about 100 nm thick, and doped polysilicon film 7 about 50 nm thick formed on doped polysilicon film 6.

Further, gate electrode 13 in the peripheral circuit portion has a stacked structure including doped polysilicon films 6, 7, 10 and WSi film 11. Except this point, the structure is basically similar to the third embodiment, and therefore the corresponding description will not be repeated.

Since floating gate electrode 8 has a stacked structure of conductive films as stated above, a desired resistance value of floating gate electrode 8 can be attained while a good state of an interface with other elements in contact with doped polysilicon films 6 and 7 is kept, in a manner similar to the second embodiment.

In addition, a desired thickness of doped polysilicon films 6 and 7 can be attained, and the coupling ratio of floating gate electrode 8 to control gate electrode 35 can be enhanced.

Referring now to FIG. 29, a method of manufacturing the non-volatile semiconductor memory device in accordance with the present embodiment will be described.

First, the surface of doped polysilicon film 6 is exposed through the steps similar to the third embodiment. On this doped polysilicon film 6, doped polysilicon film 7 is deposited by a technique similar to the second embodiment.

Following photolithography, on doped polysilicon film 7, a photoresist 33 is formed, and using this photoresist 33 as a mask, doped polysilicon film 7 is etched. Thus, doped polysilicon film 7 is formed to extend over polysilicon oxide film 21.

After patterning of doped polysilicon film 7 in this manner, photoresist 33 is removed. Thereafter, the steps similar to the third embodiment follow, to form the non-volatile semiconductor memory device shown in FIG. 28.

(Fifth Embodiment)

Although trench 29 in the peripheral circuit portion and trench 3 in the memory cell portion are formed at the same time as shown in FIG. 19, in the aforementioned third embodiment, trench 29 in the peripheral circuit portion may be formed prior to formation of trench 3 in the memory cell portion. At this point, the inner wall of trench 29 in the peripheral circuit portion is not nitrided.

Furthermore, in the step shown in FIG. 18, an opening is provided only in photoresist 28 located on the memory cell portion, while the opening is not provided in a portion covering the peripheral circuit portion. Using this photoresist 28 as a mask, silicon nitride film 18, doped polysilicon film 6 and thermal oxide film 4 located only in the memory cell portion are etched.

Other than this point, the steps similar to the third embodiment can be taken to form the non-volatile semiconductor memory device shown in FIG. 16.

It is noted that instead of trench isolation in the peripheral circuit portion, a silicon oxide film formed by LOCOS process may be used as an insulating film for element-isolation. In this case, the silicon oxide film for element-isolation in the peripheral circuit portion is formed prior to formation of trench 3 in the memory cell portion.

Thus, instead of trench 29 and silicon oxide film 21 in the peripheral circuit portion shown in FIG. 16, the non-volatile semiconductor memory device having silicon oxide film 2 shown in FIG. 1 can be formed.

(Sixth Embodiment)

In the fifth embodiment, floating gate electrode 8 may be provided as a stacked structure including doped polysilicon film 6 and doped polysilicon film 7. In this case, doped polysilicon film 7 is formed on doped polysilicon film 6 by a technique similar the second embodiment.

Thereafter, the steps similar to the fifth embodiment follow to form the non-volatile semiconductor memory device in accordance with the present embodiment. That is, the non-volatile semiconductor memory device can be formed such that floating gate electrode 8 in the fifth embodiment is provided as a stacked structure including doped polysilicon film 6 and doped polysilicon film 7.

In accordance with the present invention, since the silicon nitride is formed along the wall surface of the trench, crystal defect attributable to expansion of element-isolating insulating film can be prevented in the semiconductor substrate. In addition, since reduction in thickness of the insulating film on the nitride silicon can be prevented, the electric characteristics and reliability of the elements can be improved. Therefore, the reliability of the non-volatile semiconductor memory device can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device, comprising:

a semiconductor substrate having a main surface;

a plurality of trenches for element-isolation formed in said semiconductor substrate;

a nitrided silicon layer formed along a wall surface of said trench;

a first insulating film for element-isolation filling said trench;

a second insulating film extending from on said main surface located at a periphery of said nitrided silicon layer onto said nitrided silicon layer, a thickness of a portion located on said nitrided silicon layer being larger than a thickness of a portion located at the periphery of said nitrided silicon layer;

a floating gate electrode formed on said second insulating film and extending from on said main surface located at a periphery of said nitrided silicon layer onto said nitrided silicon layer, a thickness of a portion located at the periphery of said nitrided silicon layer being larger than a thickness of a portion located on said nitrided silicon layer; and a control gate electrode formed above said floating gate electrode with a third insulating film interposed.

2. The non-volatile semiconductor memory device according to claim 1, wherein said floating gate electrode is formed between said trenches.

3. The non-volatile semiconductor memory device according to claim 1, wherein said nitrided silicon layer is in contact with a side surface of said trench.

4. The non-volatile semiconductor memory device according to claim 1, wherein said non-volatile semiconductor memory device includes a memory cell portion in which memory cell transistors are formed, and a peripheral circuit portion in which a peripheral circuitry is formed for controlling an operation of said memory cell transistor; and said trench is formed in said memory cell portion.

5. The non-volatile semiconductor memory device according to claim 4, having a fourth insulating film for element-isolation formed by selectively oxidizing said semiconductor substrate in said peripheral circuit portion.

6. The non-volatile semiconductor memory device according to claim 1, comprising a memory cell portion in which memory cell transistors are formed, a peripheral circuit portion in which a peripheral circuitry is formed for controlling an operation of said memory cell transistor, and an MOS (Metal Oxide Semiconductor) transistor in said peripheral circuit portion; wherein said trenches include a first trench formed in said memory cell portion and a second trench formed in said peripheral circuit portion;

said nitrided silicon layer includes first and second nitrided silicon layers respectively formed along wall surfaces of said first and second trenches;

said first insulating film is formed in said first wench;

a fourth insulating film for element-isolation is formed in said second trench;

said second insulating film is formed at a periphery of said first trench, a fifth insulating film being formed at a periphery of said second trench;

said second insulating film extends from said main surface located at a periphery of said first nitrided silicon layer onto said first nitrided silicon layer;

a thickness of a portion located on said first nitrided silicon layer in said second insulating film is larger than a thickness of a portion located on said main surface at the periphery of said first nitrided silicon layer in said second insulating film;

said fifth insulating film extends from said main surface located at a periphery of said second nitrided silicon layer onto said second nitrided silicon layer;

a thickness of a portion located on said second nitrided silicon layer in said fifth insulating film is larger than a thickness of a portion located on said main surface at the periphery of said second nitrided silicon layer in said fifth insulating film; and a gate electrode of said MOS transistor is formed on said fifth insulating film.

* * * * *